US011884814B2

(12) United States Patent
Watanabe

(10) Patent No.: US 11,884,814 B2
(45) Date of Patent: Jan. 30, 2024

(54) RESIN COMPOSITION

(71) Applicant: AJINOMOTO CO., INC., Tokyo (JP)

(72) Inventor: Masatoshi Watanabe, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 125 days.

(21) Appl. No.: 17/179,866

(22) Filed: Feb. 19, 2021

(65) Prior Publication Data

US 2021/0261768 A1 Aug. 26, 2021

(30) Foreign Application Priority Data

Feb. 20, 2020 (JP) ................................ 2020-027147

(51) Int. Cl.
| C08L 63/00 | (2006.01) |
| C08L 9/00 | (2006.01) |
| C09D 109/00 | (2006.01) |
| C09D 163/00 | (2006.01) |
| C08L 33/08 | (2006.01) |
| H05K 1/03 | (2006.01) |
| C09D 133/08 | (2006.01) |

(52) U.S. Cl.
CPC ............... *C08L 63/00* (2013.01); *C08L 9/00* (2013.01); *C08L 33/08* (2013.01); *C09D 109/00* (2013.01); *C09D 133/08* (2013.01); *C09D 163/00* (2013.01); *H05K 1/032* (2013.01); *C08L 2201/02* (2013.01); *C08L 2205/025* (2013.01); *C08L 2205/035* (2013.01); *C08L 2205/20* (2013.01)

(58) Field of Classification Search
CPC .............. C08L 63/00; C08L 2205/20; H05K 2201/0254; C08K 7/22; C08K 3/36
See application file for complete search history.

(56) References Cited

U.S. PATENT DOCUMENTS

2002/0147277 A1 * 10/2002 Tsuchikawa ............ C08L 35/06
525/107
2006/0099391 A1 * 5/2006 Tomioka ................ C08L 63/00
428/209
2008/0167412 A1 * 7/2008 Elgimiabi ................ C08K 3/22
524/436
2017/0183532 A1 6/2017 Park et al.
2019/0209994 A1 7/2019 Katayama et al.

FOREIGN PATENT DOCUMENTS

| JP | 11-145572 A | | 5/1999 |
| JP | 2000313818 A | * | 11/2000 |
| JP | 2003-147166 A | | 5/2003 |
| JP | 2003147166 A | * | 5/2003 |
| JP | 2003-286332 A | | 10/2003 |
| JP | 2007048615 A | * | 2/2007 |
| JP | 2014-005464 A | | 1/2014 |
| JP | 2016-119230 A | | 6/2016 |
| JP | 2016141757 A | * | 8/2016 |
| JP | 2017-119823 A | | 6/2017 |
| JP | 2017-154087 A | | 9/2017 |
| JP | 2018-2887 A | | 1/2018 |
| JP | 2018-58959 A | | 4/2018 |
| JP | 2019-48952 A | | 3/2019 |
| JP | 2019209523 A | * | 12/2019 |
| JP | 2021-88635 A | | 6/2021 |
| KR | 2018081318 A | * | 7/2018 |
| WO | WO-2004067638 A1 | * | 8/2004 |
| WO | 2018/051794 A1 | | 3/2018 |

OTHER PUBLICATIONS

Machine translation of WO-2004067638-A1 (2004, 14 pages).*
Machine translation of JP-2000313818-A (2000, 9 pages).*
Machine translation of JP-2007048615-A (2007, 12 pages).*
Machine translation of JP-2019209523-A (2019, 18 pages).*
Machine translation of KR-2018081318-A (2018, 7 pages).*
Machine translation of JP-2016141757-A (2016, 11 pages).*
Machine translation of JP-2003147166-A (2003, 5 pages).*
Machine translation of WO-2004067638-A1 (2004, 12 pages).*
Japanese Office Action dated Feb. 14, 2023 in Japanese Patent Application No. 2020-027147 (with English Translation), 8 pages.

* cited by examiner

*Primary Examiner* — Brieann R Johnston
(74) *Attorney, Agent, or Firm* — Oblon, McClelland, Maier & Neustadt, L.L.P.

(57) ABSTRACT

Resin compositions including (A) a hollow organic polymer particle, (B) an epoxy resin, and (C) a curing agent provide cured products having a superior smear removal properties.

15 Claims, 1 Drawing Sheet

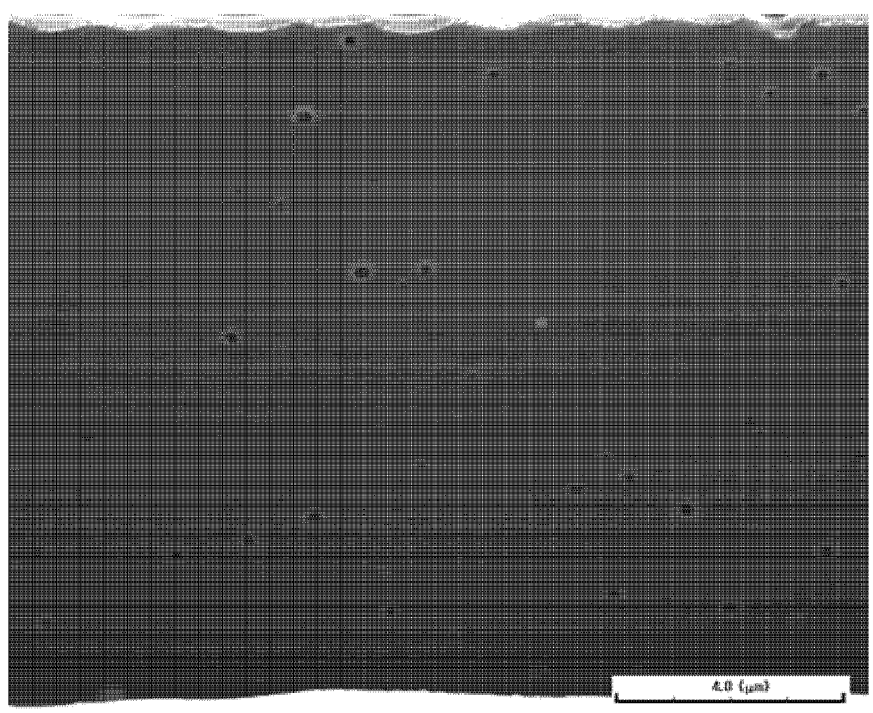

RESIN COMPOSITION

CROSS REFERENCES TO RELATED APPLICATIONS

This application claims priority to Japanese Patent Application No. 2020-027147, filed on Feb. 20, 2020, which is incorporated herein by reference in its entirety.

BACKGROUND OF THE INVENTION

Field of the Invention

The present invention relates to resin compositions including an epoxy resin. The present invention further relates to cured products, sheet-like laminate materials, resin sheets, printed wiring boards, and semiconductor devices, all being obtained by using such a resin composition.

Discussion of the Background

A build-up method in which an insulating layer and a conductive layer are alternately piled up has been known as a manufacturing technology of a printed wiring board. In the manufacturing method using the build-up method, in general, an insulating layer is formed by curing a resin composition.

When producing a multilayered printed wiring board, a smear (resin residue) that is generated upon drilling of an insulating layer and then remains in a via hole is required to be sufficiently removed in a roughening process.

Until now, it has been known that when a core-shell type organic polymer particle is used as a component in a resin composition, a crack and a warp caused by strain of an insulating layer due to temperature change at the time of producing a printed wiring board can be reduced (see Japanese Patent Application Laid-open No. 2014-005464, which is incorporated herein by reference in its entirety). In addition, various hollow organic polymer particles have been known (see Japanese Patent Application Laid-open Nos. 2016-119230, 2017-119823, and 2017-154087, as well as International Publication No. 2018/051794, all of which are incorporated herein by reference in their entireties).

SUMMARY OF THE INVENTION

Accordingly, it is one object of the present invention to provide novel resin compositions from which a cured product having a superior smear removal property can be obtained.

These and other objects, which will become apparent during the following detailed description, have been achieved by the inventors' discovery that when (A) a hollow organic polymer particle was used as a component in the resin composition, the smear removal property could be improved.

Thus, the present invention provides:

(1) A resin composition comprising (A) a hollow organic polymer particle, (B) an epoxy resin, and (C) a curing agent.

(2) The resin composition according to (1), wherein content of the component (A) is 3% or more by mass and 40% or less by mass, based on 100% by mass of non-volatile components in the resin composition.

(3) The resin composition according to (1) or (2), wherein the organic polymer included in the component (A) is an organic polymer formed of a monomer comprising an ethylenic unsaturated monomer.

(4) The resin composition according to (3), wherein the organic polymer included in the component (A) is an organic polymer formed of a monomer comprising styrene, or an organic polymer formed of a monomer comprising a (meth)acrylate ester.

(5) The resin composition according to any one of (1) to (4), wherein the component (A) is a single-hollow particle.

(6) The resin composition according to any one of (1) to (5), wherein porosity of the component (A) is 20% or more by volume.

(7) The resin composition according to any one of (1) to (6), wherein an average particle diameter of the component (A) is 0.2 μm or more and 20 μm or less.

(8) The resin composition according to any one of (1) to (7), further comprising (D) an inorganic filler.

(9) The resin composition according to any one of (1) to (8), further comprising (E) a flame retardant.

(10) The resin composition according to (9), wherein the component (E) comprises a phosphorous type flame retardant.

(11) The resin composition according to (10), wherein the component (E) comprises a phosphorous type flame retardant having a phenolic hydroxyl group.

(12) The resin composition according to any one of (1) to (11), further comprising (F) an elastomer.

(13) The resin composition according to (12), wherein the component (F) is a resin having one or more structures selected from a polybutadiene structure, a polysiloxane structure, a poly(meth)acrylate structure, a polyalkylene structure, a polyalkyleneoxy structure, a polyisoprene structure, a polyisobutylene structure, and a polycarbonate structure.

(14) The resin composition according to (13), wherein the component (F) comprises a resin having a polybutadiene structure.

(15) The resin composition according to (14), wherein the component (F) comprises a polybutadiene resin having a phenolic hydroxyl group.

(16) A cured product of the resin composition according to any one of (1) to (15).

(17) A laminate in a sheet form comprising the resin composition according to any one of (1) to (15).

(18) A resin sheet comprising a support and on the support a resin composition layer that is formed from the resin composition according to any one of (1) to (15).

(19) A printed wiring board including an insulating layer comprising a cured product of the resin composition according to any one of (1) to (15).

(20) A semiconductor device comprising the printed wiring board according to (19).

According to the resin composition of the present invention, a cured product having a superior smear removal property can be obtained.

BRIEF DESCRIPTION OF THE DRAWINGS

FIG. 1 is a picture of a cross section of a cured product of the resin composition in one embodiment of the present invention.

DETAILED DESCRIPTION OF THE PREFERRED EMBODIMENTS

Hereinafter, the present invention will be explained in detail on the basis of the preferred embodiments thereof. The present invention is, however, not limited to the embodiments nor to the exemplified materials described below;

therefore, the present invention can be carried out with an arbitrary modification thereof so far as the modified embodiments and materials are not outside the claims or the equivalents thereof.

Resin Composition

The resin composition according to the present invention includes (A) a hollow organic polymer particle, (B) an epoxy resin, and (C) a curing agent. When the resin composition like this is used, a cured product having a superior smear removal property can be obtained.

The resin composition according to the present invention may further include an arbitrary component, in addition to (A) the hollow organic polymer particle, (B) the epoxy resin, and (C) the curing agent. Illustrative examples of the arbitrary component include (A') a non-hollow organic polymer particle, (D) an inorganic filler, (E) a flame retardant, (F) an elastomer, (G) a thermoplastic resin, (H) other additive, and (I) an organic solvent. Hereinafter, each component that is included in the resin composition will be explained in detail.

(A) Hollow Organic Polymer Particle

The resin composition according to the present invention includes (A) the hollow organic polymer particle. (A) The hollow organic polymer particle is a particle including an organic polymer having a void inside the particle. (A) The hollow organic polymer particle is present in the form of particle in the resin composition.

An embodiment of a formation of a void in (A) the hollow organic polymer particle is not particularly restricted; although this may be in the form of a single-hollow particle having one void inside the particle or in the form of a multi-hollow particle having a plurality of voids inside the particle (including a hollow multi-void particle that is porous inside the particle), the form of the single-hollow particle is preferable.

Although (A) the hollow organic polymer particle may be any of a spherical particle and a non-spherical particle, the spherical particle is preferable. (A) The hollow organic polymer particle is preferably the one having a shell formed of at least one or more layers. The layer that constitutes the shell may be formed of one layer or a plurality of layers (two or more layers). (A) The hollow organic polymer particle may be in the form that the void therein is covered with the shell.

An organic polymer included in (A) the hollow organic polymer particle is preferably an organic polymer formed from a monomer including an ethylenic unsaturated monomer. The ethylenic unsaturated monomer has at least one or more ethylenic unsaturated group. The ethylenic unsaturated group is not particularly restricted so far as this can be radically polymerized; thus, this may be an ethylenic unsaturated group having a carbon-carbon double bond inside or at the terminal of the molecule thereof. Specific examples thereof include: unsaturated aliphatic groups such as an allyl group and a 3-cyclohexenyl group; aromatic groups having an unsaturated aliphatic group such as a p-vinylphenyl group, a m-vinylphenyl group, and a styryl group; and α,β-unsaturated carbonyl groups such as an acryloyl group, a methacryloyl group, a maleoyl group, and a fumaroyl group.

Illustrative examples of the ethylenic unsaturated monomer include a monofunctional ethylenic unsaturated monomer, a polyfunctional ethylenic unsaturated monomer, an ethylenic unsaturated monomer having silyl group(s), and an ethylenic unsaturated monomer having epoxy group(s).

The monofunctional ethylenic unsaturated monomer is a compound having one ethylenic unsaturated group. The monofunctional ethylenic unsaturated monomer is not particularly restricted. Illustrative examples thereof include: monofunctional aromatic olefin compounds including monofunctional aromatic vinyl type compounds such as styrene, α-methylstyrene, o-methylstyrene, m-methylstyrene, p-methylstyrene, o-ethylstyrene, m-ethylstyrene, p-ethylstyrene, 1-vinylnaphthalene, and 2-vinylnaphthalene, as well as monofunctional aromatic allyl type compounds such as allylbenzene and 1-allyl-4-methylbenzene; monofunctional olefin ester compounds such as vinyl acetate, vinyl propionate, allyl acetate, allyl propionate, vinyl lactate, and vinyl benzoate; monofunctional olefin ether compounds such as allyl ethyl ether; monofunctional ethylenic unsaturated carboxylate esters including aliphatic (meth)acrylate esters such as methyl (meth)acrylate, ethyl (meth)acrylate, propyl (meth)acrylate, butyl (meth)acrylate, isobutyl (meth)acrylate, tert-butyl (meth)acrylate, pentyl (meth)acrylate, hexyl (meth)acrylate, heptyl (meth)acrylate, octyl (meth)acrylate, nonyl (meth)acrylate, decyl (meth)acrylate, norbornyl (meth)acrylate, isobornyl (meth)acrylate, adamantyl (meth)acrylate, lauryl (meth)acrylate, tetradecyl (meth)acrylate, stearyl (meth)acrylate, isobornyl (meth)acrylate, and 2-ethylhexyl (meth)acrylate, aromatic (meth)acrylate esters such as phenoxyethyl (meth)acrylate and phenoxy diethylene glycol (meth)acrylate, hydroxy-containing (meth)acrylate esters such as 2-hydroxyethyl (meth)acrylate and 2-hydroxypropyl (meth)acrylate, and also halogen-containing (meth)acrylate esters such as 2,2,2-trifluoroethyl (meth)acrylate, cyano-containing (meth)acrylate esters such as methyl cyano(meth)acrylate, ethyl cyano(meth)acrylate, propyl cyano(meth)acrylate, and isopropyl cyano(meth)acrylate; monofunctional ethylenic unsaturated carboxylic amides such as (meth)acrylamide, maleimide, N-methylmaleimide, and N-phenylmaleimide; monofunctional ethylenic unsaturated carboxylic acids such as (meth)acrylic acid, maleic acid, fumaric acid, and itaconic acid; and monofunctional ethylenic unsaturated nitrile compounds such as (meth)acrylonitrile. "(Meth)acrylate" includes an acrylate and a methacrylate. The same is applied to "(meth)acrylic acid", "(meth)acrylamide", "(meth)acrylonitrile", and the like. These monofunctional ethylenic unsaturated monomers may be used singly, or two or more of them may be used concurrently.

The polyfunctional ethylenic unsaturated monomer is a compound having a plurality of the ethylenic unsaturated groups. The polyfunctional ethylenic unsaturated monomer is not particularly restricted. Illustrative examples thereof include: conjugated diolefins such as butadiene and isoprene; polyfunctional aromatic olefin compounds including polyfunctional aromatic vinyl compounds such as p-divinylbenzene and m-divinylbenzene; polyfunctional olefin ester compounds such as diallyl phthalate, triallyl isocyanurate, triallyl cyanurate, diallyl maleate, divinyl adipate, and divinyl glutarate; polyfunctional olefin ether compounds such as tetraallyloxy ethane and diallyl ether; polyfunctional ethylenic unsaturated carboxylate esters such as ethylene glycol di(meth)acrylate, diethylene glycol di(meth)acrylate, triethylene glycol di(meth)acrylate, 1,6-hexanediol di(meth)acrylate, trimethylolpropane tri(meth)acrylate, pentaerythritol tri(meth)acrylate, pentaerythritol tetra(meth)acrylate, dipentaerythritol penta(meth)acrylate, and dipentaerythritol hexa(meth)acrylate; and polyfunctional ethylenic unsaturated carboxylic amides such as N,N'-ethylene bis(meth)acrylamide. These polyfunctional ethylenic unsaturated monomers may be used singly, or two or more of them may be used concurrently.

The ethylenic unsaturated monomer having silyl group(s) is a compound having at least one or more ethylenic unsaturated groups, and silyl group(s) such as a trialkoxy silyl group and an alkyl dialkoxy silyl group. The ethylenic unsaturated monomer having silyl group(s) is not particularly restricted. Illustrative examples thereof include: vinylsilane type compounds such as vinyltrimethoxysilane and vinyltriethoxysilane; aromatic olefinic silane compounds such as p-vinylphenyltrimethoxysilane; and ethylenic unsaturated carboxylate ester silane type compounds such as 3-methacryloxypropylmethyldimethoxysilane, 3-methacryloxypropyltrimethoxysilane, 3-methacryloxypropylmethyldiethoxysilane, 3-methacryloxypropyltriethoxysilane, 8-methacryloxyoctyltriethoxysilane, and 3-acryloxypropyltrimethoxysilane. These ethylenic unsaturated monomers having silyl group(s) may be used singly, or two or more of them may be used concurrently.

The ethylenic unsaturated monomer having epoxy group(s) is a compound having at least one or more ethylenic unsaturated groups, and epoxy group(s). The ethylenic unsaturated monomer having epoxy group(s) is not particularly restricted. Illustrative examples thereof include: aromatic olefinic compounds having epoxy group(s) such as styrene-4-glycidyl ether and 4-glycidylstyrene; olefin ether compounds having epoxy group(s) such as allyl glycidyl ether; and ethylenic unsaturated carboxylate esters having epoxy group(s) such as glycidyl (meth)acrylate, 4-hydroxybutyl (meth)acrylate glycidyl ether, and 3,4-epoxycyclohexylmethyl (meth)acrylate. These ethylenic unsaturated monomers having epoxy group(s) may be used singly, or two or more of them may be used concurrently.

It is preferable that the monomer that constitutes a polymer included in the organic polymer to form (A) the hollow organic polymer particle further include a crosslinkable monomer in the case that the ethylenic unsaturated monomer having epoxy group(s) is included therein. Illustrative examples of the crosslinkable monomer include: aliphatic polyamines such as ethylenediamine, diethylenetriamine, dipropylenetriamine, triethylenetetramine, tetraethylenepentamine, hexamethylene diamine, N-(2-aminoethyl)piperazine, 1,4-bis(3-aminopropyl)piperazine, 2,4,4-trimethylhexamethylenediamine, 2,2,4-trimethylhexamethylenediamine, bis(hexamethylene)triamine, poly(propyleneglycol)diamine, 4,4'-diamino-3,3'-dimethyldicyclohexylmethane, 3-amino-1-(cyclohexylamino)propane, 4,4'-diaminodicyclohexylmethane, isophoronediamine, 1,3-bis(aminomethyl)cyclohexane, and bis(aminomethyl)norbornane; and aromatic amines such as 4,4'-diaminodiphenylmethane, 4,4'-diaminodiphenyl ether, 4,4'-diaminodiphenyl sulfone, m-phenylenediamine, p-phenylenediamine, 2,3-toluylenediamine, 2,4-toluylenediamine, and 2,5-toluylenediamine. These crosslinkable monomers may be used singly, or two or more of them may be used concurrently.

In one embodiment, the organic polymer included in (A) the hollow organic polymer particle is more preferably an organic polymer formed from a monomer including one or more monomers selected from aromatic olefin compounds (for example, the monofunctional aromatic olefin compounds, the polyfunctional aromatic olefin compounds, the aromatic olefin silane type compounds, and the aromatic olefin compounds having epoxy group(s)) and ethylenic unsaturated carboxylate esters (for example, the monofunctional ethylenic unsaturated carboxylate esters, the polyfunctional ethylenic unsaturated carboxylate esters, the ethylenic unsaturated carboxylate ester silane type compounds, and the ethylenic unsaturated carboxylate esters having epoxy group(s)). The organic polymer included in (A) the hollow organic polymer particle is still more preferably an organic polymer formed from a monomer including one or more monomers selected from the aromatic olefin compounds, or an organic polymer formed from a monomer including one or more monomers selected from the ethylenic unsaturated carboxylate esters. The organic polymer included in (A) the hollow organic polymer particle is far still more preferably an organic polymer formed from a monomer including styrene, or an organic polymer formed from a monomer including a (meth)acrylate ester.

In one embodiment, the organic polymer included in (A) the hollow organic polymer particle is still more preferably an organic polymer formed from a monomer including one or more monomers selected from the ethylenic unsaturated monomer having silyl group(s) and the ethylenic unsaturated monomer having epoxy group(s).

(A) The hollow organic polymer particle may be treated with a surface modifying agent. Illustrative examples of the surface modifying agent for (A) the hollow organic polymer particle include: inorganic acids such as hydrochloric acid, nitric acid, and sulfuric acid; organic acids including carboxylic acids such as acetic acid, propionic acid, lactic acid, and acrylic acid, sulfonic acids such as p-toluenesulfonic acid, ethylsulfonic acid, and dodecylbenzenesulfonic acid, phosphoric acids such as polyoxyethylene alkyl ether phosphoric acid, and also phosphonic acids and phosphynic acids; silane coupling agents such as tetraethoxysilane, methyltrimethoxysilane, phenyltrimethoxysilane, 3-(meth)acryloxypropyltrimethoxysilane, and 8-(meth)acryloxyoctyltrimethoxysilane; and isocyanate type compounds such as ethyl isocyanate.

Although porosity of (A) the hollow organic polymer particle is not particularly restricted, the porosity is preferably 1 or more by volume, or 5% or more by volume, more preferably 10% or more by volume, still more preferably 15% or more by volume, and far still more preferably 20% or more by volume, while especially preferably 25% or more by volume. The upper limit of the porosity of (A) the hollow organic polymer particle is not particularly restricted; this can be, for example, 99% or less by volume, 95% or less by volume, 90% or less by volume, 80% or less by volume, 70% or less by volume, and 60% or less by volume. The porosity is the ratio of the void volume inside the particle relative to the total volume of the particle.

Although the average particle diameter of (A) the hollow organic polymer particle is not particularly restricted, this is preferably 100 μm or less, more preferably 50 μm or less, still more preferably 30 μm or less, and far still more preferably 20 μm or less, while especially preferably 10 μm or less. Although the lower limit of the average particle diameter of (A) the hollow organic polymer particle is not particularly restricted, this is preferably 0.01 μm or more, more preferably 0.05 μm or more, still more preferably 0.1 μm or more, and far still more preferably 0.2 μm or more, while especially preferably 0.3 μm or more. The average particle diameter of (A) the hollow organic polymer particle is in terms of a number-average value.

Illustrative examples of (A) the hollow organic polymer particle that is commercially available include "XX-5598Z" manufactured by Sekisui Kasei Co., Ltd. Alternatively, (A) the hollow organic polymer particle may be produced by using a heretofore known method. Illustrative examples of the heretofore known method include those described in International Publication No. 2018/051794, Japanese Patent Application Laid-open Nos. 2017-119843, 2017-119843, and 2016-119230, as well as Japanese Examined Patent Publication No. H04-68324, and Japanese Patent Application Laid-open Nos. S63-135409 and 2002-241448, all of which are incorporated herein by reference in their entireties.

Although the content of (A) the hollow organic polymer particle in the resin composition is not particularly restricted, the content is preferably 0.1% or more by mass, more preferably 1% or more by mass, still more preferably 2% or more by mass, and far still more preferably 3% or more by mass, while especially preferably 4% or more by mass, on the basis of 100% by mass of nonvolatile components in the resin composition. Although the upper limit of the content of (A) the hollow organic polymer particle in the resin composition is not particularly restricted, this is preferably 60% or less by mass, and more preferably 50% or less by mass, while still more preferably 40% or less by mass, on the basis of 100% by mass of nonvolatile components in the resin composition.

(A') Non-Hollow Organic Polymer Particle

The resin composition according to the present invention may further include, in addition to (A) the hollow organic polymer particle, (A') a non-hollow organic polymer particle as an arbitrary nonvolatile component. (A') The non-hollow organic polymer particle is a particle of an organic polymer not having a void inside the particle.

In the resin composition, (A') the non-hollow organic polymer particle exists in the form of particle. Illustrative examples of (A') the non-hollow organic polymer particle include a non-hollow rubber particle, a non-hollow polyamide particle, and a non-hollow silicone particle. Among these, the non-hollow rubber particle is preferable.

Illustrative examples of the rubber component included in the non-hollow rubber particle include: thermoplastic elastomers including olefin type thermoplastic elastomers such as polybutadiene, polyisoprene, polychlorobutadiene, an ethylene-vinyl acetate copolymer, a styrene-butadiene copolymer, a styrene-isoprene copolymer, a styrene-isobutylene copolymer, an acrylonitrile-butadiene copolymer, an isoprene-isobutylene copolymer, an isobutylene-butadiene copolymer, an ethylene-propylene-diene tercopolymer, and an ethylene-propylene-butene tercopolymer, and also acrylic thermoplastic elastomers such as polypropyl (meth)acrylate, polybutyl (meth)acrylate, polycyclohexyl (meth)acrylate, and polyoctyl (meth)acrylate.

From a viewpoint to clearly obtain intended effects of the present invention, (A') the non-hollow organic polymer particle is preferably a core-shell type rubber particle. The core-shell type rubber particle is a rubber particle in the form of particle that is formed of a core particle containing the rubber component mentioned above and a shell portion formed of one or more layers to cover the core particle. The core-shell type rubber particle includes not only the particle in which the core particle and the shell portion can be clearly distinguished, but also the particle in which the boundary between the core particle and the shell portion is unclear. The core particle is not necessarily completely covered with the shell portion. Illustrative examples of the monomer component that forms the shell portion in the core-shell type rubber particle include those monomers mentioned as the ethylenic unsaturated monomers explained in (A) the hollow organic polymer particle.

Although the average particle diameter (average primary particle diameter) of (A') the non-hollow organic polymer particle is not particularly restricted, this is preferably 20 nm or more, more preferably 50 nm or more, and still more preferably 80 nm or more, while especially preferably 100 nm or more. Although the upper limit of the average particle diameter (average primary particle diameter) of (A') the non-hollow organic polymer particle is not particularly restricted, this is preferably 5,000 nm or less, more preferably 2,000 nm or less, and still more preferably 1,000 nm or less, while especially preferably 500 nm or less. The average particle diameter (average primary particle diameter) of (A') the non-hollow organic polymer particle may be measured by using a zeta potential particle size distribution measurement instrument or the like.

Illustrative examples of the core-shell type rubber particle that is commercially available include: "IM401-4-14" manufactured by Aica Kogyo Co., Ltd.; "CHT" manufactured by Cheil Industries, Inc.; "B602" manufactured by UMG ABS, Ltd.; "Paraloid EXL-2602", "Paraloid EXL-2603", "Paraloid EXL-2655", "Paraloid EXL-2311", "Paraloid EXL2313", "Paraloid EXL-2315", "Paraloid KM-330", "Paraloid KM-336P", and "Paraloid KCZ-201", all of which are manufactured by Dow Chemical Japan, Ltd.; "Metablen C-223A", "Metablen E-901", "Metablen S-2001", "Metablen W-450A", and "Metablen SRK-200", all of which are manufactured by Mitsubishi Rayon Co., Ltd.; and "Kane Ace M-511", "Kane Ace M-600", "Kane Ace M-400", "Kane Ace M-580", and "Kane Ace MR-01", all of which are manufactured by Kaneka Corp. These products may be used singly, or as a mixture of two or more of them.

Although the content of (A') the non-hollow organic polymer particle in the resin composition is not particularly restricted, the content is preferably 40% or less by mass, more preferably 30% or less by mass, still more preferably 20% or less by mass, and far still more preferably 10% or less by mass, while especially preferably 7% or less by mass, on the basis of 100% by mass of nonvolatile components in the resin composition. The lower limit of the content of (A') the non-hollow organic polymer particle in the resin composition is not particularly restricted. In one embodiment, this can be, for example, 0% or more by mass, 0.1% or more by mass, 1% or more by mass, 3% or more by mass, and 5% or more by mass, on the basis of 100% by mass of nonvolatile components in the resin composition.

Although the mass ratio of (A') the non-hollow organic polymer particle to (A) the hollow organic polymer particle in the resin composition ((A') non-hollow organic polymer particle/(A) hollow organic polymer particle) is not particularly restricted, this is preferably 10 or less, more preferably 2 or less, and still more preferably 1.5 or less, while especially preferably 1.2 or less.

(B) Epoxy Resin

The resin composition according to the present invention includes (B) the epoxy resin. (B) The epoxy resin means a curable resin having epoxy group(s).

Illustrative examples of (B) the epoxy resin include a bixylenol type epoxy resin, a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolak type epoxy resin, a phenol novolak type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolak type epoxy resin, a phenol aralkyl type epoxy resin, a biphenyl type epoxy resin, a linear aliphatic epoxy resin, an epoxy resin having a butadiene structure, an alicyclic epoxy resin, a heterocyclic epoxy resin, an epoxy resin having a spiro ring, a cyclohexane type epoxy resin, a cyclohexane dimethanol type epoxy resin, a naphthylene ether type epoxy resin, a trimethylol type epoxy resin, a tetraphenylethane type epoxy resin, an isocyanurate type epoxy resin, a phenolphthalimidine type epoxy resin, and a phenolphthalein type epoxy resin. (B) These epoxy resins may be used singly or as a combination of two or more of them.

It is preferable that the resin composition include, as (B) the epoxy resin, an epoxy resin having two or more epoxy groups in one molecule thereof. The rate of the epoxy resin having two or more epoxy groups in one molecule relative to 100% by mass of nonvolatile components in (B) the epoxy resin is preferably 50% or more by mass, and more preferably 60% or more by mass, while especially preferably 70% or by mass.

In the epoxy resin, there are an epoxy resin that is in the state of liquid at 20° C. (hereinafter, this is also called "liquid epoxy resin") and an epoxy resin that is in the state of solid at 20° C. (hereinafter, this is also called "solid epoxy resin"). The resin composition according to the present invention may include, as the epoxy resin, only the liquid epoxy resin, or only the solid epoxy resin, or combination of the liquid epoxy resin and the solid epoxy resin. The epoxy resin in the resin composition according to the present invention is preferably the solid epoxy resin or a combination of the liquid epoxy resin and the solid epoxy resin, and the solid epoxy resin is more preferable.

As the liquid epoxy resin, a liquid epoxy resin having two or more epoxy groups in one molecule is preferable.

The liquid epoxy resin is preferably a bisphenol A type epoxy resin, a bisphenol F type epoxy resin, a bisphenol AF type epoxy resin, a naphthalene type epoxy resin, a glycidyl ester type epoxy resin, a glycidyl amine type epoxy resin, a phenol novolak type epoxy resin, an alicyclic epoxy resin having an ester skeleton, a cyclohexane type epoxy resin, a cyclohexane dimethanol type epoxy resin, and an epoxy resin having a butadiene structure.

Specific examples of the liquid epoxy resin include "HP4032", "HP4032D", and "HP4032SS" (these are naphthalene type epoxy resins) manufactured by DIC Corp.; "828US", "828EL", "jER828EL", "825", and "Epikote 828EL" (these are bisphenol A type epoxy resins) manufactured by Mitsubishi Chemical Corp.; "jER807" and "1750" (both are bisphenol F type epoxy resins) manufactured by Mitsubishi Chemical Corp.; "jER152" (phenol novolak type epoxy resin) manufactured by Mitsubishi Chemical Corp.; "630", "630LSD", and "604" (these are glycidyl amine type epoxy resins) manufactured by Mitsubishi Chemical Corp.; "ED-523T" (a glycyrol type epoxy resin) manufactured by ADEKA Corp.; "EP-3950L" and "EP-3980S" (both are glycidyl amine type epoxy resins) manufactured by ADEKA Corp.; "EP-4088S" (a dicyclopentadiene type epoxy resin) manufactured by ADEKA Corp.; "ZX1059" (mixture of a bisphenol A type epoxy resin and a bisphenol F type epoxy resin) manufactured by Nippon Steel Chemical & Materials Co., Ltd.); "EX-721" (a glycidyl ester type epoxy resin) manufactured by Nagase ChemteX Corp.; "Celloxide 2021P" (an alicyclic epoxy resin having an ester skeleton) manufactured by Daicel Corp.; "PB-3600" manufactured by Daicel Corp., "JP-100" and "JP-200" manufactured by Nippon Soda Co., Ltd. (all these three are epoxy resins having a butadiene skeleton); and "ZX1658" and "ZX1658GS" (both are liquid 1,4-glycidyl cyclohexane type epoxy resins) manufactured by Nippon Steel Chemical & Materials Co., Ltd. These may be used singly or as a combination of two or more of them.

As the solid epoxy resin, a solid epoxy resin having three or more epoxy groups in one molecule thereof is preferable, while an aromatic solid epoxy resin having three or more epoxy groups in one molecule thereof is more preferable.

The solid epoxy resin is preferably a bixylenol type epoxy resin, a naphthalene type epoxy resin, a naphthalene type tetrafunctional epoxy resin, a naphthol novolak type epoxy resin, a cresol novolak type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol A type epoxy resin, a bisphenol AF type epoxy resin, a phenol aralkyl type epoxy resin, a tetraphenylethane type epoxy resin, a phenolphthalimidine type epoxy resin, and a phenolphthalein type epoxy resin.

Specific examples of the solid epoxy resin include "HP4032H" (a naphthalene epoxy type resin) manufactured by DIC Corp.; "HP-4700" and "HP-4710" (both are naphthalene type tetrafunctional epoxy resins) manufactured by DIC Corp.; "N-690" (a cresol novolak type epoxy resin) manufactured by DIC Corp.; "N-695" (a cresol novolak type epoxy resin) manufactured by DIC Corp.; "HP-7200", "HP-7200HH", "HP-7200H", and "HP-7200L" (these are dicyclopentadiene type epoxy resins) manufactured by DIC Corp.); "EXA-7311", "EXA-7311-G3", "EXA-7311-G4", "EXA-7311-G4S", and "HP6000" (these are naphthylene ether type epoxy resins) manufactured by DIC Corp.; "EPPN-502H" (a trisphenol type epoxy resin) manufactured by Nippon Kayaku Co., Ltd.; "NC7000L" (a naphthol novolak type epoxy resin) manufactured by Nippon Kayaku Co., Ltd.; "NC3000H", "NC3000", "NC3000L", "NC3000FH", and "NC3100" (these are biphenyl type epoxy resins) manufactured by Nippon Kayaku Co., Ltd.; "ESN475V" (a naphthalene type epoxy resin) manufactured by Nippon Steel Chemical & Materials Co., Ltd.; "ESN485" (a naphthol type epoxy resin) manufactured by Nippon Steel Chemical & Materials Co., Ltd.; "ESN375" (a dihydroxy naphthalene type epoxy resin) manufactured by Nippon Steel Chemical & Materials Co., Ltd.; "YX4000H", "YX4000", "YX4000HK", and "YL7890" (these are bixylenol type epoxy resins) manufactured by Mitsubishi Chemical Corp.; "YL6121" (a biphenyl type epoxy resin) manufactured by Mitsubishi Chemical Corp.; "YX8800" (an anthracene type epoxy resin) manufactured by Mitsubishi Chemical Corp.; "YX7700" (a phenol aralkyl type epoxy resin) manufactured by Mitsubishi Chemical Corp.; "PG-100" and "CG-500" manufactured by Osaka Gas Chemicals Co., Ltd.; "YL7760" (a bisphenol AF type epoxy resin) manufactured by Mitsubishi Chemical Corp.; "YL7800" (a fluorene type epoxy resin) manufactured by Mitsubishi Chemical Corp.; "jER1010" (a bisphenol A type epoxy resin) manufactured by Mitsubishi Chemical Corp.; "jER1031S" (a tetraphenylethane type epoxy resin) manufactured by Mitsubishi Chemical Corp.; and "WHR991S" (a phenolphthalimidine type epoxy resin) manufactured by Nippon Kayaku Co., Ltd. These may be used singly or as a mixture of two or more of them.

When the liquid epoxy resin and the solid epoxy resin are concurrently used as the component (B), although the mass ratio of the liquid epoxy resin to the solid epoxy resin (liquid epoxy resin/solid epoxy resin) is not particularly restricted, this is preferably 10 or less, more preferably 5 or less, still more preferably 3 or less, and far still more preferably 1 or less, while especially preferably 0.8 or less.

The epoxy equivalent of (B) the epoxy resin is preferably in the range of 50 g/eq. to 5,000 g/eq., more preferably in the range of 60 g/eq. to 2,000 g/eq., and still more preferably in the range of 70 g/eq. to 1,000 g/eq., while far still more preferably in the range of 80 g/eq. to 500 g/eq. The epoxy equivalent is a mass of a resin per one equivalent of the epoxy group thereof. The epoxy equivalent may be measured in accordance with JIS K7236.

The weight-average molecular weight (Mw) of (B) the epoxy resin is preferably in the range of 100 to 5,000, and more preferably in the range of 250 to 3,000, while still more preferably in the range of 400 to 1,500. The weight-average molecular weight of the resin may be measured as a value in terms of polystyrene by a gel permeation chromatography (GPC) method.

Although the content of (B) the epoxy resin in the resin composition is not particularly restricted, the content is preferably 70% or less by mass, more preferably 60% or less by mass, still more preferably 50% or less by mass, and far still more preferably 40% or less by mass, while especially preferably 35% or less by mass, on the basis of 100% by mass of nonvolatile components in the resin composition. Although the lower limit of the content of (B) the epoxy resin in the resin composition is not particularly restricted, the content is preferably 0.1% or more by mass, more preferably 1% or more by mass, still more preferably 5% or more by mass, and far still more preferably 10% or more by mass, while especially preferably 15% or more by mass, on the basis of 100% by mass of nonvolatile components in the resin composition.

(C) Curing Agent

The resin composition according to the present invention includes (C) the curing agent. (C) The curing agent can be classified to (C-1) an epoxy curing agent having a function to cure (B) the epoxy resin and to (C-2) a curing accelerator having a function to facilitate curing of (B) the epoxy resin. It is preferable that the resin composition according to the present invention include, as (C) the curing agent, at least any one of (C-1) the epoxy curing agent and (C-2) the curing accelerator. (C) The curing agent explained here is a component not corresponding to (E) the flame retardant or to (F) the elastomer.

Although the content of (C) the curing agent in the resin composition is not particularly restricted, the content is preferably 60% or less by mass, more preferably 50% or less by mass, still more preferably 40% or less by mass, and far still more preferably 30% or less by mass, while especially preferably 25% or less by mass, on the basis of 100% by mass of nonvolatile components in the resin composition. The lower limit of the content of (C) the curing agent in the resin composition is not particularly restricted; this can be, for example, 0.001% or more by mass, 0.01% or more by mass, 0.1% or more by mass, and 0.2% or more by mass, on the basis of 100% by mass of nonvolatile components in the resin composition.

(C-1) Epoxy Curing Agent (C-1) The epoxy curing agent is not particularly restricted. Illustrative examples thereof include a phenol type curing agent, a naphthol type curing agent, an acid anhydride type curing agent, an amine type curing agent, an active ester type curing agent, a benzoxazine type curing agent, a cyanate ester type curing agent, and a carbodiimide type curing agent. (C-1) These epoxy curing agents may be used singly or as a combination of two or more of them.

In view of a heat resistance and a water resistance, it is preferable that the phenol type curing agent and the naphthol type curing agent are a phenol type curing agent having a novolak structure, or a naphthol type curing agent having a novolak structure. In view of the adhesion property to a body to be adhered, a nitrogen-containing phenol type curing agent or a nitrogen-containing naphthol type curing agent is preferable, while a phenol type curing agent having a triazine skeleton or a naphthol type curing agent having a triazine skeleton is more preferable. In particular, in view of highly satisfying a heat resistance, a water resistance, and an adhesion property, a phenol novolak resin having a triazine skeleton is preferable. Specific examples of the phenol type curing agent and the naphthol type curing agent include: "MEH-7700", "MEH-7810", "MEH-7851", and "MEH-8000" manufactured by Meiwa Plastic Industries, Ltd.; "NHN", "CBN", and "GPH" manufactured by Nippon Kayaku Co., Ltd.; "SN-170", "SN-180", "SN-190", "SN-475", "SN-485", "SN-495V", "SN-375", and "SN-395" manufactured by Nippon Steel Chemical & Materials Co., Ltd.; "TD-2090", "LA-7052", "LA-7054", "LA-1356", "LA-3018", "LA-3018-50P", "LA-1356", "TD-2090-60M", "EXB-9500", "HPC-9500", "KA-1160", "KA-1163", and "KA-1165" manufactured by DIC Corp.; and "GDP-6115L" and "GDP-6115H" manufactured by Gun Ei Chemical Industry Co., Ltd.

The acid anhydride type curing agent may be a curing agent having one or more acid anhydride groups in one molecule thereof, and a curing agent having two or more acid anhydride groups in one molecule thereof is preferable. Specific examples of the acid anhydride type curing agent include phthalic anhydride, tetrahydrophthalic anhydride, hexahydrophthalic anhydride, methyltetrahydrophthalic anhydride, methylhexahydrophthalic anhydride, methylnadic anhydride, hydrogenated methylnadic anhydride, trialkyltetrahydrophthalic anhydride, dodecenylsuccinic anhydride, 5-(2,5-dioxotetrahydro-3-furanyl)-3-methyl-3-cyclohexene-1,2-dicarboxylic anhydride, trimellitic anhydride, pyromellitic anhydride, benzophenonetetracarboxylic dianhydride, biphenyltetracarboxylic dianhydride, naphthalenetetracarboxylic dianhydride, oxydiphthalic dianhydride, 3,3'-4,4'-diphenylsulfonetetracarboxylic dianhydride, 1,3,3a,4,5,9b-hexahydro-5-(tetrahydro-2,5-dioxo-3-furanyl)-naphtho[1,2-C]furan-1,3-dione, ethylene glycol bis(anhydrotrimellitate), and an anhydride of a polymer type acid such as a styrene-maleic acid resin obtained by copolymerizing styrene and maleic acid. Illustrative examples of the acid anhydride type curing agent that is commercially available include: "HNA-100", "MH-700", "MTA-15", "DDSA", and "OSA" manufactured by New Japan Chemical Co., Ltd.; "YH-306" and "YH-307" manufactured by Mitsubishi Chemical Corp.; and "HN-2200" and "HN-5500" manufactured by Hitachi Chemical Co., Ltd.

The amine type curing agent may be a curing agent having one or more amino groups, preferably two or more amino groups, in one molecule thereof. Illustrative examples thereof include aliphatic amines, polyether amines, alicyclic amines, and aromatic amines. Among these, from a viewpoint to clearly express intended effects of the present invention, aromatic amines are preferable. The amine type curing agent is preferably a primary amine or a secondary amine, while a primary amine is more preferable. Specific examples of the amine type curing agent include 4,4'-methylenebis(2,6-dimethylaniline), 4,4'-diaminodiphenylmethane, 4,4'-diaminodiphenyl sulfone, 3,3'-diaminodiphenyl sulfone, m-phenylenediamine, m-xylylenediamine, diethyltoluenediamine, 4,4'-diaminodiphenyl ether, 3,3'-dimethyl-4,4'-diaminobiphenyl, 2,2'-dimethyl-4,4'-diaminobiphenyl, 3,3T-dihydroxybenzidine, 2,2-bis(3-amino-4-hydroxyphenyl)propane, 3,3-dimethyl-5,5-diethyl-4,4-diphenylmethanediamine, 2,2-bis(4-aminophenyl)propane, 2,2-bis(4-(4-aminophenoxy)phenyl)propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(4-aminophenoxy)phenyl) sulfone, and bis(4-(3-aminophenoxy)phenyl) sulfone. Commercially available amine type curing agents may be used as well. Illustrative examples thereof include: "SEIKACURE-S" manufactured by SEIKA Corp.; "KAYABOND C-2005", "KAYABOND C-100", "KAYAHARD A-A", "KAYAHARD A-B", and "KAYAHARD A-S" manufactured by Nippon Kayaku Co., Ltd.); and "Epicure W" manufactured by Mitsubishi Chemical Corp.

There is no particular restriction in the active ester type curing agent. In general, compounds having two or more ester groups having a high reactivity in one molecule can be preferably used. Illustrative examples of the highly reactive ester groups include phenol esters, thiophenol esters, N-hydroxylamine esters, and esters of heterocyclic hydroxy compounds. The active ester type curing agent is preferably a compound that is obtained by a condensation reaction of a carboxylic acid compound and/or a thiocarboxylic acid compound with a hydroxy compound and/or with a thiol compound. Especially, from a viewpoint to enhance a heat resistance, an active ester type curing agent obtained from a carboxylic acid compound and a hydroxy compound is preferable, while an active ester type curing agent obtained from a carboxylic acid compound and a phenol compound and/or a naphthol compound is more preferable. Illustrative examples of the carboxylic acid compound include benzoic acid, acetic acid, succinic acid, maleic acid, itaconic acid, phthalic acid, isophthalic acid, terephthalic acid, and pyromellitic acid. Illustrative examples of the phenol compound or the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene type diphenol compound, and phenol novolak. Here, the "dicyclopentadiene type diphenol compound" means a diphenol compound obtained by condensation of one dicyclopentadiene molecule with two phenol molecules.

Specifically, an active ester type curing agent containing a dicyclopentadiene type diphenol structure, an active ester type curing agent containing a naphthalene structure, an active ester type curing agent containing an acetylated phenol novolak, and an active ester type curing agent containing a benzoylated phenol novolak are preferable; among these, the active ester type curing agent containing a naphthalene structure and the active ester type curing agent containing a dicyclopentadiene type diphenol structure are more preferable. Here, the "dicyclopentadiene type diphenol structure" means a divalent structure formed of phenylene-dicyclopentylene-phenylene.

Illustrative examples of the active ester type curing agent that is commercially available include: as the active ester type curing agent containing a dicyclopentadiene type diphenol structure, "EXB9451", "EXB9460", "EXB9460S", "EXB9460S-65T", "HPC-8000", "HPC-8000H", "HPC-8000-65T", "HPC-8000H-65TM", "EXB-8000L", "EXB-8000L-65M", and "EXB-8000L-65TM" (these are manufactured by DIC Corp.); as the active ester type curing agent containing a naphthalene structure, "EXB-9416-70BK", "EXB-8150-65T", "EXB-8100L-65T", and "EXB-8150L-65T" (these are manufactured by DIC Corp.); as the active ester type curing agent containing an acetylated phenol novolak, "DC808" (manufactured by Mitsubishi Chemical Corp.); as the active ester type curing agent containing a benzoylated phenol novolak, "YLH1026" (manufactured by Mitsubishi Chemical Corp.), "YLH1030" (manufactured by Mitsubishi Chemical Corp.), and "YLH1048" (manufactured by Mitsubishi Chemical Corp.).

Specific examples of the benzoxazine type curing agent include "JBZ-OP100D" and "ODA-BOZ" manufactured by JFE Chemical Corp.; "HFB2006M" manufactured by Showa Highpolymer Co., Ltd.; and "P-d" and "F-a" manufactured by Shikoku Chemicals Corp.

Illustrative examples of the cyanate ester type curing agent include: bifunctional cyanate resins such as bisphenol A dicyanate, polyphenol cyanate, oligo(3-methylene-1,5-phenylenecyanate), 4,4'-methylenebis(2,6-dimethylphenylcyanate), 4,4'-ethylidene diphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl) thioether, and bis(4-cyanatephenyl) ether; polyfunctional cyanate resins derived from a phenol novolak, a cresol novolak, and the like; and a prepolymer in which these cyanate resins are partially made to triazine. Specific examples of the cyanate ester type curing agent include "PT30" and "PT60" (both are phenol novolak type polyfunctional cyanate ester resins); and "BA230" and "BA230S75" (both are prepolymers in which part or all of bisphenol A dicyanate is made to triazine so as to be a trimer); all of these agents being manufactured by Lonza Japan Ltd.

Specific examples of the carbodiimide type curing agent include "V-03" and "V-07" manufactured by Nisshinbo Chemical, Inc.

The activity equivalent of (C-1) the epoxy curing agent is preferably in the range of 50 g/eq. to 3,000 g/eq., more preferably in the range of 100 g/eq. to 1,000 g/eq., and still more preferably in the range of 100 g/eq. to 500 g/eq., while especially preferably in the range of 100 g/eq. to 300 g/eq. The activity equivalent is a mass of (C-1) the epoxy curing agent per one equivalent of the active group thereof. The active group in (C) the curing agent is, for example, a phenolic hydroxyl group in the cases of the phenol type curing agent and the naphthol type curing agent, and an active ester group in the case of the active ester type curing agent; therefore, the active group is different depending on the curing agent.

Although the content of (C-1) the epoxy curing agent in the resin composition is not particularly restricted, the content is preferably 60% or less by mass, more preferably 50% or less by mass, still more preferably 40% or less by mass, and far still more preferably 30% or less by mass, while especially preferably 25% or less by mass, on the basis of 100% by mass of nonvolatile components in the resin composition. The lower limit of the content of (C-1) the epoxy curing agent in the resin composition is not particularly restricted; this can be, for example, 0% or more by mass, 0.01% or more by mass, 0.1% or more by mass, 1% or more by mass, 5% or more by mass, and 10% or more by mass, on the basis of 100% by mass of nonvolatile components in the resin composition.

When a component having an active group such as a phenolic hydroxy group is used as (E) the flame retardant or (F) the elastomer, these have the same function as (C-1) the epoxy curing agent; thus, there is no need to use (C-1) the epoxy curing agent.

(C-2) Curing Accelerator (C-2) The curing accelerator is not particularly restricted; illustrative examples thereof include a phosphorous type curing accelerator, a urea type curing accelerator, an amine type curing accelerator, an imidazole type curing accelerator, a guanidine type curing accelerator, and a metal type curing accelerator. (C-2) These curing accelerators may be used singly or as a mixture of two or more of them.

Illustrative examples of the phosphorous type curing accelerator include: aliphatic phosphonium salts such as tetrabutylphosphonium bromide, tetrabutylphosphonium chloride, tetrabutylphosphonium acetate, tetrabutylphosphonium decanoate, tetrabutylphosphonium laurate, bis(tetrabutylphosphonium) pyromellitate, tetrabutylphosphonium hydrogen hexahydrophthalate, tetrabutylphosphonium 2,6-bis[(2-hydroxy-5-methylphenyl)methyl]-4-methylphenolate, and di-tert-butylmethylphosphonium tetraphenylborate; aromatic phosphonium salts such as methyltriphenylphosphonium bromide, ethyltriphenylphosphonium bromide, propyltriphenylphosphonium bromide, butyltriphenylphosphonium bromide, benzyltriphenylphosphonium chloride, tetraphenylphosphonium bromide, p-tolyltriphenylphosphonium tetra-p-tolylborate, tetraphenylphosphonium tetraphenylborate, tetraphenylphosphonium tetra-p-tolylborate, triphenylethylphosphonium tetraphenylborate, tris(3-methylphenyl)ethylphosphonium tetraphenylborate, tris(2-methoxyphenyl)ethylphosphonium tetraphenylborate, (4-methylphenyl)triphenylphosphonium thiocyanate, tetraphenylphosphonium thiocyanate, and butyltriphenylphosphonium thiocyanate; aromatic phosphine-borane complexes such as triphenylphosphine-triphenylborane; aromatic phosphine-quinone addition reaction products such as a triphenylphosphine-p-benzoquinone addition reaction product; aliphatic phosphines such as tributylphosphine, tri-tert-butylphosphine, trioctylphosphine, di-tert-butyl(2-butenyl)phosphine, di-tert-butyl(3-methyl-2-butenyl)phosphine, and tricyclohexylphosphine; and aromatic phosphines such as dibutylphenylphosphine, di-tert-butylphenylphosphine, methyldiphenylphosphine, ethyldiphenylphosphine, butyldiphenylphosphine, diphenylcyclohexylphosphine, triphenylphosphine, tri-o-tolylphosphine, tri-m-tolylphosphine, tri-p-tolylphosphine, tris(4-ethylphenyl)phosphine, tris(4-propylphenyl)phosphine, tris(4-isopropylphenyl)phosphine, tris(4-butylphenyl)phosphine, tris(4-tert-butylphenyl)phosphine, tris(2,4-dimethylphenyl)phosphine, tris(2,5-dimethylphenyl)phosphine, tris(2,6-dimethylphenyl)phosphine, tris(3,5-dimethylphenyl)phosphine, tris(2,4,6-trimethylphenyl)phosphine, tris(2,6-dimethyl-4-ethoxyphenyl)phosphine, tris(2-methoxyphenyl)phosphine, tris(4-methoxyphenyl)phosphine, tris(4-ethoxyphenyl)phosphine, tris(4-tert-butoxyphenyl)phosphine, diphenyl-2-pyridylphosphine, 1,2-bis(diphenylphosphino)ethane, 1,3-bis(diphenylphosphino)propane, 1,4-bis(diphenylphosphino)butane, 1,2-bis(diphenylphosphino)acetylene, and 2,2'-bis(diphenylphosphino)diphenyl ether.

Illustrative examples of the urea type curing accelerator include: 1,1-dimethylurea; aliphatic dimethylureas such as 1,1,3-trimethylurea, 3-ethyl-1,1-dimethylurea, 3-cyclohexyl-1,1-dimethylurea, and 3-cyclooctyl-1,1-dimethylurea; and aromatic dimethylureas such as 3-phenyl-1,1-dimethylurea, 3-(4-chlorophenyl)-1,1-dimethylurea, 3-(3,4-dichlorophenyl)-1,1-dimethylurea, 3-(3-chloro-4-methylphenyl)-1,1-dimethylurea, 3-(2-methylphenyl)-1,1-dimethylurea, 3-(4-methylphenyl)-1,1-dimethylurea, 3-(3,4-dimethylphenyl)-1,1-dimethylurea, 3-(4-isopropylphenyl)-1,1-dimethylurea, 3-(4-methoxyphenyl)-1,1-dimethylurea, 3-(4-nitrophenyl)-1,1-dimethylurea, 3-[4-(4-methoxyphenoxy)phenyl]-1,1-dimethylurea, 3-[4-(4-chlorophenoxy)phenyl]-1,1-dimethylurea, 3-[3-(trifluoromethyl)phenyl]-1,1-dimethylurea, N,N-(1,4-phenylene)bis(N',N'-dimethylurea), and N,N-(4-methyl-1,3-phenylene)bis(N',N'-dimethylurea) [toluenebisdimethylurea].

Illustrative examples of the guanidine type curing accelerator include dicyandiamide, 1-methylguanidine, 1-ethylguanidine, 1-cyclohexylguanidine, 1-phenylguanidine, 1-(o-tolyl)guanidine, dimethylguanidine, diphenyl guanidine, trimethylguanidine, tetramethylguanidine, pentamethylguanidine, 1,5,7-triazabicyclo[4.4.0]deca-5-ene, 7-methyl-1,5,7-triazabicyclo[4.4.0]deca-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide.

Illustrative examples of the imidazole type curing accelerator include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2T-ethyl-4T-metylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrro[1,2-a]benzimidazole, 1-dodecyl-2-methyl-3-benzylimidazolium chloride, 2-methylimidazoline, and 2-phenylimidazoline; and adducts of these imidazole compounds with an epoxy resin.

Commercially available imidazole type curing accelerators may be used. Illustrative examples thereof include "1B2PZ", "2MZA-PW", "2PHZ-PW" Shikoku Chemicals Corp., and "P200-H50" manufactured by Mitsubishi Chemical Corp.

Illustrative examples of the metal type curing accelerator include organic metal complexes or organic metal salts of metals such as cobalt, copper, zinc, iron, nickel, manganese, and tin. Specific examples of the organic metal complex include organic cobalt complexes such as cobalt(II) acetylacetonate and cobalt(III) acetylacetonate; organic copper complexes such as copper(II) acetylacetonate; organic zinc complexes such as zinc(II) acetylacetonate; organic iron complexes such as iron(III) acetylacetonate; organic nickel complexes such as nickel(II) acetylacetonate; and organic manganese complexes such as manganese(II) acetylacetonate. Illustrative examples of the organic metal salt include zinc octylate, tin octylate, zinc naphthenate, cobalt naphthenate, tin stearate, and zinc stearate.

Illustrative examples of the amine type curing accelerator include: trialkyl amines such as triethyl amine and tributyl amine; and 4-dimethylaminopyridine, benzyl dimethyl amine, 2,4,6-tris(dimethylaminomethyl)phenol, and 1,8-diazabicyclo(5,4,0)-undecene.

Commercially available amine type curing accelerators may be used. Illustrative examples thereof include "MY-25" manufactured by Ajinomoto Fine-Techno Co., Ltd.

Although the content of (C-2) the curing accelerator in the resin composition is not particularly restricted, the content is preferably 10% or less by mass, more preferably 5% or less by mass, still more preferably 3% or less by mass, and far still more preferably 1% or less by mass, while especially preferably 0.5% or less by mass, on the basis of 100% by mass of nonvolatile components in the resin composition. The lower limit of the content of (C-2) the curing accelerator in the resin composition is not particularly restricted; this can be, for example, 0% or more by mass, 0.001% or more by mass, 0.01% or more by mass, 0.1% or more by mass, and 0.2% or more by mass, on the basis of 100% by mass of nonvolatile components in the resin composition.

(D) Inorganic Filler

The resin composition according to the present invention can include (D) the inorganic filler as the arbitrary component. (D) The inorganic filler is included in the state of particle in the resin composition.

An inorganic compound is used as (D) the inorganic filler. Illustrative examples of (D) the inorganic filler include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among them, silica is especially preferable. Illustrative examples of the silica include amorphous silica, fused silica, crystalline silica, synthesized silica, and hollow silica. Spherical silica is preferable as the silica. (D) The inorganic fillers may be used singly or as a combination of two or more of them with an arbitrary ratio.

Illustrative examples of (D) the inorganic filler that is commercially available include "UFP-30" manufactured by Denka Co., Ltd.; "SP60-05" and "SP507-05" manufactured by Nippon Steel Chemical & Materials Co., Ltd.; "YC100C", "YA050C", "YA050C-MJE", and "YA010C" manufactured by Admatechs Co., Ltd.; "UFP-30" manufactured by Denka Co., Ltd.; "Silfil NSS-3N", "Silfil NSS-4N", and "Silfil NSS-5N" manufactured by Tokuyama Corp.; "SC2500SQ", "SO-C4", "SO-C2", and "SO-C1" manufactured by Admatechs Co., Ltd.; and "DAW-03" and "FB-105FD" manufactured by Denka Co., Ltd.

Although the average particle diameter of (D) the inorganic filler is not particularly restricted, this is preferably 10 μm or less, more preferably 5 μm or less, still more preferably 2 μm or less, and far still more preferably 1 μm or less, while especially preferably 0.7 μm or less. Although the lower limit of the average particle diameter of (D) the inorganic filler is not particularly restricted, this is preferably 0.01 μm or more, more preferably 0.05 μm or more, and still more preferably 0.1 μm or more, while especially preferably 0.2 μm or more. The average particle diameter of (D) the inorganic filler may be measured by using a laser diffraction scattering method based on the Mie scattering theory. Specifically, the particle diameter distribution of the inorganic filler on the volume basis is prepared by using a laser diffraction scattering type particle diameter distribution measurement instrument; and the average particle diameter may be measured by taking a median diameter as the average particle diameter. A measurement sample obtained by weighing 100 mg of an inorganic filler and 10 g of methyl ethyl ketone into a vial bottle followed by dispersing the resulting mixture by mean of an ultrasonic wave for 10 minutes may be used. This measurement sample was measured by using the laser diffraction type particle diameter distribution measurement instrument with light source wavelengths of a blue light and a red light using a flow cell method to obtain the particle diameter distribution of the inorganic filler on the volume basis; and from the thereby obtained particle diameter distribution, the average particle diameter was calculated as the median diameter. Illustrative examples of the laser diffraction type particle diameter distribution measurement instrument include "LA-960" manufactured by Horiba Ltd.

Specific surface area of (D) the inorganic material is not particularly restricted, and it is preferably 0.1 $m^2/g$ or more, more preferably 0.5 $m^2/g$ or more, and still more preferably 1 $m^2/g$ or more, while especially preferably 3 $m^2/g$ or more. The upper limit of the specific surface area of (D) the inorganic material is not particularly restricted, and it is preferably 100 $m^2/g$ or less, more preferably 70 $m^2/g$ or less, and still more preferably 50 $m^2/g$ or less, while especially preferably 40 $m^2/g$ or less. The specific surface area of the inorganic material may be calculated by means of a BET multipoint method, in which a nitrogen gas is adsorbed onto the sample surface in accordance with a BET method by using a specific surface area measurement apparatus (Macsorb HM-1210: manufactured by Mountech Co. Ltd.).

It is preferable that (D) the inorganic filler is surface-modified with a suitable surface modifying agent. With this surface modification, a humidity resistance and a dispersion property of (D) the inorganic filler can be enhanced. Illustrative examples of the surface modifying agent include silane coupling agents such as: vinyl silane coupling agents such as vinyltrimethoxysilane, and vinyltriethoxysilane; epoxy silane coupling agents such as 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane; styryl silane coupling agents such as p-styryltrimethoxysilane; methacrylic coupling agents such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; acrylic coupling agents such as 3-acryloxypropyltrimethoxysilane; amino silane coupling agents such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-phenyl-8-aminooctyltrimethoxysilane, and N-(vinylbenzyl)-2-aminoethyl-3-aminopropyltrimethoxysilane; isocyanurate silane coupling agents such as tris-(trimethoxysilylpropyl)isocyanurate; ureido silane coupling agents such as 3-ureidopropyltrialkoxysilane; mercapto silane coupling agents such as 3-mercaptopropylmethyldimethoxysilane, and 3-mercaptopropyltrimethoxysilane; isocyanate silane coupling agents such as 3-isocyanatepropyltriethoxysilane; acid anhydride silane coupling agents such as 3-trimethoxysilylpropylsuccinic anhydride; and non-silane coupling-alkoxy silane compounds such as methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, and trifluoropropyltrimethoxysilane. These surface modifying agents may be used singly or as a combination of two or more of them with an arbitrary ratio.

Illustrative examples of the surface modifying agent that is commercially available include those manufactured by Shin-Etsu Chemical Co., Ltd., such as "KBM-1003" and "KBE-1003" (vinyl type silane coupling agents); "KBM-303", "KBM-402", "KBM-403", "KBE-402", and "KBE-403" (epoxy type silane coupling agents); "KBM-1403" (a styryl type silane coupling agent); "KBM-502", "KBM-503", "KBE-502", and "KBE-503" (methacrylic silane coupling agents); "KBM-5103" (an acrylic silane coupling agent); "KBM-602", "KBM-603", "KBM-903", "KBE-903", "KBE-9103P", "KBM-573", and "KBM-575" (amino silane coupling agents); "KBM-9659" (an isocyanurate type silane coupling agent); "KBE-585" (a ureido type silane coupling agent); "KBM-802" and "KBM-803" (mercapto type silane coupling agents); "KBE-9007N" (an isocyanate type silane coupling agent); "X-12-967C" (an acid anhydride type silane coupling agent); and "KBM-13", "KBM-22", "KBM-103", "KBE-13", "KBE-22", "KBE-103", "KBM-3033", "KBE-3033", "KBM-3063", "KBE-3063", "KBE-3083", "KBM-3103C", "KBM-3066", and "KBM-7103" (non-silane coupling-alkoxy silane compounds).

From a viewpoint to enhance a dispersion property of the inorganic filler, the degree of the surface modification by means of the surface modifying agent is preferably within a prescribed range. Specifically, the inorganic filler is surface-modified with a surface modifying agent preferably in the range of 0.2 to 5% by mass, and more preferably in the range of 0.2 to 3% by mass, while still more preferably in the range of 0.3 to 2% by mass, relative to 100% by mass of the inorganic filler.

The degree of the surface modification by the surface modifying agent may be evaluated by the carbon amount per unit surface area of the inorganic filler. In view of enhancement of the dispersion property of the inorganic filler, the carbon amount per unit surface area of the inorganic filler is preferably 0.02 mg/m$^2$ or more, and more preferably 0.1 mg/m$^2$ or more, while still more preferably 0.2 mg/m$^2$ or more. On the other hand, in view of prevention of the increase in the melt viscosity of the resin composition and in the melt viscosity in the sheet form thereof, the carbon amount is preferably 1.0 mg/m$^2$ or less, and more preferably 0.8 mg/m$^2$ or less, while still more preferably 0.5 mg/m$^2$ or less.

The carbon amount per unit surface area of (D) the inorganic filler may be measured after the inorganic filler whose surface has been modified is cleaned by a solvent (for example, methyl ethyl ketone (MEK)). Specifically, after a sufficient amount of MEK as the solvent is added to the inorganic filler whose surface has been modified with a surface modifying agent, this is cleaned by means of an ultrasonic wave at 25° C. for 5 minutes. The supernatant solution thereof is removed; and then, after the remaining solid component is dried, the carbon amount per unit surface area of the inorganic filler may be measured by using a carbon analysis apparatus. The carbon analysis apparatus such as "EMIA-320V" manufactured by Horiba Ltd., and the like may be used.

Although the content of (D) the inorganic filler in the resin composition is not particularly restricted, the content is preferably 90% or less by mass, more preferably 80% or less by mass, still more preferably 70% or less by mass, and far still more preferably 60% or less by mass, while especially preferably 55% or less by mass, on the basis of 100% by mass of nonvolatile components in the resin composition. The lower limit of the content of (D) the inorganic filler in the resin composition is not particularly restricted; this can be, for example, 0% or more by mass, 0.01% or more by mass, 0.1% or more by mass, 1% or more by mass, and 10% or more by mass, on the basis of 100% by mass of non-volatile components in the resin composition.

(E) Flame Retardant

The resin composition according to the present invention can include (E) the flame retardant as the arbitrary component.

Illustrative examples of (E) the flame retardant include: phosphorous type flame retardants such as phosphazene compounds, phosphate salts, phosphate esters, polyphosphate salts, phosphinate salts, phosphinate esters, phosphonate salts, and phosphonate esters; nitrogen type flame retardants such as aliphatic amine compounds, aromatic amine compounds, nitrogen-containing heterocyclic compounds, and urea compounds; inorganic flame retardants including metal hydroxides such as magnesium hydroxide and aluminum hydroxide, and also antimony compounds such as antimony trioxide, antimony pentaoxide, and sodium antimonate; and halogen type flame retardants such hexabromobenzene, chlorinated paraffin, a brominated polycarbonate resin, a brominated epoxy resin, a brominated phenoxy resin, a brominated polyphenylene ether resin, a brominated polystyrene resin, and a brominated benzyl polyacrylate resin. Among these, phosphorous type flame retardants are preferable. (E) These flame retardants may be used singly, or two or more of them may be used concurrently.

Illustrative examples of the phosphazene compound include phenoxycyclophosphazene compounds such as hexaphenoxycyclotriphosphazene, tris(4-hydroxyphenoxy) triphenoxycyclotriphosphazene, hexakis(4-hydroxyphenoxy)cyclotriphosphazene, tris(4-methylphenoxy)triphenoxycyclotriphosphazene, tris(4-cyanophenoxy) triphenoxycyclotriphosphazene, hexakis(4-aminophenoxy) cyclotriphosphazene, tris[4-(2-glycidyloxyethyl)phenoxy] triphenoxycyclotriphosphazene, and octaphenoxycyclotetraphosphazene.

Illustrative examples of the phosphate salt include ammonium phosphate, melamine phosphate, and piperazine phosphate.

Illustrative examples of the phosphate ester include: non-halogen type aliphatic phosphate esters such as trimethyl phosphate, triethyl phosphate, tributyl phosphate, and trioctyl phosphate; non-halogen type aromatic phosphate esters such as triphenyl phosphate, cresyl diphenyl phosphate, dicresyl phenyl phosphate, tricresyl phosphate, tris(2,6-dimethylphenyl) phosphate, tris(4-isopropylphenyl) phosphate, tris(4-tert-butylphenyl) phosphate, bis(4-tert-butylphenyl) phenyl phosphate, hydroxyphenyl diphenyl phosphate, octyl diphenyl phosphate, and 2-ethylhexyl diphenyl phosphate; and halogen type aliphatic phosphate esters such as tris(l-chloro-2-propyl) phosphate, tris(1,3-dichloro-2-propyl) phosphate, and tris[3-bromo-2,2-bis(bromomethyl)propyl] phosphate.

Illustrative examples of the polyphosphate salt include ammonium polyphosphate and melamine polyphosphate.

Illustrative examples of the phosphinate salt include: dialkyl phosphinate salts such as aluminum tris(diethylphosphinate), zinc bis(diethylphosphinate), aluminum tris(m-ethylethylphosphinate), zinc bis(methylethylphosphinate), and titanium tetrakis(diethylphosphinate); and diaryl phosphinate salts such as zinc bis(diphenylphosphinate) and titanium tetrakis(diphenylphosphinate).

Illustrative examples of the phosphinate ester include: dialkyl phosphinate esters such as methyl dimethylphosphinate, ethyl dimethylphosphinate, ethyl diethylphosphinate, vinyl diethylphosphinate, and phenyl diethylphosphinate;

non-cyclic diaryl phosphinate esters such as phenyl diphenylphosphinate, methyl diphenylphosphinate, and ethyl diphenylphosphinate; cyclic diaryl phosphinate esters such as 10-(2,5-dihydroxyphenyl)-9,10-dihydro-9-oxa-10-phosphaphenanthlene-10-oxide, 10-(1,4-dihydroxy-2-naphthyl)-9,10-dihydro-9-oxa-10-phosphaphenanthlene-10-oxide, 10-(2,5-dihydroxybiphenyl-4-yl)-9,10-dihydro-9-oxa-10-phosphaphenanthlene-10-oxide, and 10-[2,4-di(glycidyloxy)phenyl]-9,10-dihydro-9-oxa-10-phosphaphenanthlene-10-oxide; cyclic monoaryl phosphinate esters such as 9,10-dihydro-9-oxa-10-phosphaphenanthlene-10-oxide; and cyclic arylalkyl phosphinate esters such as 9,10-dihydro-10-benzyl-9-oxa-10-phosphaphenanthlene-10-oxide, 10-[2,3-bis(2-hdyroxyethoxycarbonyl)propyl]-9,10-dihydro-9-oxa-10-phosphaphenanthlene-10-oxide or polyether polycondensate thereof, 10-(2-cyanoethyl)-9,10-dihydro-9-oxa-10-phosphaphenanthlene-10-oxide, 10-[2-(3,4-epoxycyclohexyl)ethyl]-9,10-dihydro-9-oxa-10-phosphaphenanthlene-10-oxide, and 10-(3-glycidyloxypropyl)-9,10-dihydro-9-oxa-10-phosphaphenanthlene-10-oxide.

Illustrative examples of the phosphonate salt include zinc methanephosphonate, zinc ethylphosphonate, zinc butylphosphonate, and zinc phenylphosphonate.

Illustrative examples of the phosphonate ester include: aliphatic phosphonate esters such as diphenyl methylphosphonate, dibutyl butylphosphonate, diethyl ethylphosphonate, diethyl (methoxymethyl)phosphonate, and diethyl vinylphosphonate; and aromatic phosphonate esters such as diethyl phenylphosphonate, divinyl phenylphosphonate, and diallyl phenylphosphonate.

(E) The flame retardant includes preferably the phosphorous type flame retardant, and more preferably the phosphorous type flame retardant having a phenolic hydroxyl group, while especially preferably the phosphinate ester having a phenolic hydroxyl group. Although the phenolic hydroxy equivalent of the phosphorous type flame retardant having a phenolic hydroxyl group is not particularly restricted, this is preferably in the range of 80 g/eq. to 1,000 g/eq., more preferably in the range of 100 g/eq. to 500 g/eq., still more preferably in the range of 110 g/eq. to 300 g/eq., and far still more preferably in the range of 120 g/eq. to 200 g/eq., while further preferably in the range of 130 g/eq. to 180 g/eq. The phenolic hydroxy equivalent is a mass of the phosphorous type flame retardant per one equivalent of the phenolic hydroxy group thereof. The phosphorous type flame retardant having a phenolic hydroxyl group has a function to cure (B) the epoxy resin, similarly to (C-1) the epoxy curing agent.

Illustrative examples of (E) the flame retardant that is commercially available include "SPH-100", "SPS-100", "SPB-100", and "SPE-100" (these are phosphazene compounds) manufactured by Otsuka Chemical Co., Ld.; "FP-100", "FP-110", "FP-300", and "FP-400" (these are phosphazene compounds) manufactured by Fushimi Pharmaceutical Co., Ltd.; "HCA-NQ", "HCA-HQ", and "HCA-HQ-HST" (these are phosphynate esters (having a phenolic hydroxyl group)) manufactured by Sanko Co., Ltd.; and "PX-200", "PX-201", "PX-202", "CR-733S", "CR-741", and "CR-747" (these are phosphate esters) manufactured by Daihachi Chemical Co., Ltd.

Although the content of (E) the flame retardant in the resin composition is not particularly restricted, the content is preferably 30% or less by mass, more preferably 20% or less by mass, still more preferably 15% or less by mass, and far still more preferably 10% or less by mass, while especially preferably 8% or less by mass, on the basis of 100% by mass of nonvolatile components in the resin composition. The lower limit of the content of (E) the flame retardant in the resin composition is not particularly restricted; this can be, for example, 0% or more by mass, 0.01% or more by mass, 0.1% or more by mass, and 1% or more by mass, on the basis of 100% by mass of nonvolatile components in the resin composition.

(F) Elastomer

The resin composition according to the present invention can include (F) the elastomer as the arbitrary component. When (F) the elastomer is used, a cured product of the resin composition can have enhanced flexibility thereby leading to decrease in the elastic modulus thereof.

(F) The elastomer in the present invention means a resin having flexibility. (F) The elastomer is an amorphous resin component capable of being dissolved in the organic solvent. (F) The elastomer is preferably a resin having rubber elasticity or a resin exhibiting rubber elasticity by polymerizing other components. The resin exhibiting rubber elasticity is, for example, a resin exhibiting an elastic modulus of 1 GPa or less upon executing an elongation test in accordance with Japanese Industry Standard (JIS K7161) at 25° C. and the humidity of 40% RH.

In one embodiment, the component (F) is preferably a resin having in the molecule thereof one or more structures selected from the group consisting of a polybutadiene structure, a polysiloxane structure, a poly(meth)acrylate structure, a polyalkylene structure, a polyalkyleneoxy structure, a polyisoprene structure, a polyisobutylene structure, and a polycarbonate structure. In view of obtaining a material having flexibility, this component is more preferably a resin having one or more structures selected from a polybutadiene structure and a polycarbonate structure, while especially preferably a resin having a polybutadiene structure. Here, "(meth)acrylate" means a methacrylate and an acrylate.

In another embodiment, the component (F) is preferably one or more resins selected from the resins whose glass transition temperatures (Tg) are 25° C. or lower and the resins that are in the state of liquid at 25° C. or lower. The glass transition temperature of the resin whose glass transition temperature (Tg) is 25° C. or lower is preferably 20° C. or lower, while more preferably 15° C. or lower. Although the lower limit of the glass transition temperature thereof is not particularly restricted, usually this can be −15° C. or higher. The resin that is in the state of liquid at 25° C. is preferably a resin that is in the state of liquid at 20° C. or lower, while more preferably a resin that is in the state of liquid at 15° C. or lower.

In more preferable one embodiment, the component (F) is preferably one or more resins that are selected from the resins whose glass transition temperature are 25° C. or lower and the resins whose state at 25° C. is liquid, and at the same time having in the molecule thereof one or more structures selected from a polybutadiene structure, a polysiloxane structure, a poly(meth)acrylate structure, a polyalkylene structure, a polyalkyleneoxy structure, a polyisoprene structure, a polyisobutylene structure, and a polycarbonate structure.

The polybutadiene structure includes not only a structure formed by polymerization of butadiene but also a structure formed by hydrogenation of this structure. The butadiene structure may be partially hydrogenated or totally hydrogenated in its structure. In the component (F), the polybutadiene structure may be included in a main chain or in a side chain thereof.

Illustrative examples of the polybutadiene resin that is preferable include a resin having a hydrogenated polybutadiene skeleton, a polybutadiene resin having a hydroxy group, a polybutadiene resin having a phenolic hydroxy group, a polybutadiene resin having a carboxy group, a polybutadiene resin having an acid anhydride group, a polybutadiene resin having an epoxy group, a polybutadiene resin having an isocyanate group, and a polybutadiene resin having a urethane group. Among these, the polybutadiene resin having a phenolic hydroxy group is more preferable. Here, "the resin having a hydrogenated polybutadiene skeleton" is a resin whose polybutadiene skeleton is at least partially hydrogenated, and thus, the resin is not necessarily the one whose polybutadiene skeleton is completely hydrogenated. The resin having a hydrogenated polybutadiene skeleton may be exemplified by an epoxy resin having a hydrogenated polybutadiene skeleton. "The polybutadiene resin having a phenolic hydroxy group" is a resin having a polybutadiene structure and a phenolic hydroxy group. The component (F) preferably includes the polybutadiene resin having a phenolic hydroxy group.

Specific examples of the polybutadiene resin, the resin having a polybutadiene structure in its molecule, include; "Ricon 657" (a polybutadiene having an epoxy group) manufactured by Cray Valley Ltd.; "Ricon 130MA8", "Ricon 130MA13", "Ricon 130MA20", "Ricon 131MA5", "Ricon 131MA10", "Ricon 131MA17", "Ricon 131MA20", and "Ricon 184MA6" (these are polybutadienes having an acid anhydride group) manufactured by Cray Valley Ltd.; "GQ-1000" (a polybutadiene introduced with a hydroxy group and a carboxyl group) manufactured by Cray Valley Ltd.; "G-1000", "G-2000", and "G-3000" (these are polybutadienes having hydroxy groups at both terminals) manufactured by Cray Valley Ltd.; "GI-1000", "GI-2000", and "GI-3000" (these are hydrogenated polybutadienes having hydroxy groups at both terminals) manufactured by Cray Valley Ltd.; "PB3600" and "PB4700" (both are epoxy compounds having a polybutadiene skeleton) manufactured by Daicel Corp.; "Epofriend A1005", "Epofriend A1010", and "Epofriend A1020" (these are epoxy compounds of styrene-butadiene-styrene block copolymers) manufactured by Daicel Corp.; "FCA-061L" (an epoxy compound having a hydrogenated polybutadiene skeleton) manufactured by Nagase ChemteX Corp.; and "R-45EPT" (an epoxy compound having a polybutadiene skeleton) manufactured by Nagase ChemteX Corp.

Preferable examples of the polybutadiene resin also include a linear polyimide prepared from raw materials, which are a polybutadiene terminated with hydroxy group (s), a diisocyanate compound, and a polybasic acid or an anhydride thereof (the polyimide disclosed in Japanese Patent Laid-open No. 2006-37083 and International Publication No. 2008/153208, which are incorporated herein by reference in their entireties). The content rate of the polybutadiene structure in the polyimide resin is preferably in the range of 60 to 95% by mass, while more preferably in the range of 75 to 85% by mass. For details of the polyimide resin, the descriptions of Japanese Patent Laid-open No. 2006-37083 and International Publication No. 2008/153208, which are incorporated herein by reference in their entireties, can be taken into consideration; and the contents thereof are incorporated into this specification.

The number-average molecular weight of the polybutadiene terminated with a hydroxy group(s) is preferably in the range of 500 to 5,000, while more preferably in the range of 1,000 to 4,000. The hydroxy equivalent of the polybutadiene terminated with hydroxy group(s) is preferably in the range of 250 to 1,250 g/eq.

Illustrative examples of the diisocyanate compound include: aromatic diisocyanates such as toluene-2,4-diisocyanate, toluene-2,6-diisocyanate, xylylene diisocyanate, and diphenylmethane diisocyanate; aliphatic diisocyanates such as hexamethylene diisocyanate; and alicyclic diisocyanates such as isophorone diisocyanate. Among them, aromatic diisocyanates are preferable, while toluene-2,4-diisocyanate is more preferable.

Illustrative examples of the polybasic acid or the anhydride thereof include: tetrabasic acids and the anhydrides thereof such as ethylene glycol bistrimellitic acid, pyromellitic acid, benzophenonetetracarboxylic acid, biphenyltetracarboxylic acid, naphthalenetetracarboxylic acid, 5-(2,5-dioxotetrafurfuryl)-3-methyl-cyclohexene-1,2-dicarboxylic acid, and 3,3'-4,4'-diphenylsulfone tetracarboxylic acid; tribasic acids and the anhydrides thereof such as trimellitic acid, and cyclohexanetricarboxylic acid; and 1,3,3a,4,5,9b-hexahydro-5-(tetrahydro-2,5-dioxo-3-furanyl)-naphtho(1,2-C)furan-1,3-dione.

The resin having a polybutadiene structure can include a polystyrene structure obtained by polymerization of styrene.

Specific examples of the polystyrene resin, which is the resin having a polystyrene structure in the molecule thereof, include a styrene-butadiene-styrene block copolymer (SBS), a styrene-isoprene-styrene block copolymer (SIS), a styrene-ethylene-butylene-styrene block copolymer (SEBS), a styrene-ethylene-propylene-styrene block copolymer (SEPS), a styrene-ethylene-ethylene-propylene-styrene block copolymer (SEEPS), a styrene-butadiene-butylene-styrene block copolymer (SBBS), a styrene-butadiene diblock copolymer, a hydrogenated styrene-butadiene block copolymer, a hydrogenated styrene-isoprene block copolymer, and a hydrogenated styrene-butadiene random copolymer.

A commercially available polystyrene resin may be used. Illustrative examples thereof include: "H1041", "Tuftec H1043", "Tuftec P2000", and "Tuftec MP10" (all are hydrogenated styrene type thermoplastic elastomers) manufactured by Asahi Kasei Corp.; "Epofriend AT501" and "CT310", both of which are epoxidized styrene-butadiene type thermoplastic elastomers (manufactured by Daicel Corp.); "Septon HG252" that is a modified styrene type elastomer having a hydroxy group (manufactured by Kuraray Co., Ltd.); "Tuftec N503M" that is a modified styrene type elastomer having a carboxy group, "Tuftec N501" that is a modified styrene type elastomer having an amino group, and "Tuftec M1913" that is a modified styrene type elastomer having an acid anhydride group (all three of them being manufactured by Asahi Kasei Chemicals Corp.); and "Septon S8104" that is an unmodified styrene type elastomer (manufactured by Kuraray Co., Ltd.). These resins may be used singly or a combination of two or more.

The polysiloxane structure is the structure including a siloxane bond; and this is included, for example, in a silicone rubber. The polysiloxane structure may be included in a main chain or in a side chain in the component (F).

Illustrative examples of the polysiloxane resin, which is the resin having the polysiloxane structure in the molecule thereof, include "SMP-2006", "SMP-2003PGMEA", and "SMP-5005PGMEA" manufactured by Shin-Etsu Silicone Co., Ltd.; and a linear polyimide prepared from raw materials of a polysiloxane terminated with amine group(s) and a tetrabasic acid anhydride (see International Publication No. 2010/053185, which is incorporated herein by reference in its entirety).

The poly(meth)acrylate structure is the structure formed by polymerizing acrylic acid or an acrylate ester, and includes also the structure formed by polymerizing methacrylic acid or a methacrylate ester. The (meth)acrylate structure may be included in a main chain or in a side chain in the component (F).

Preferable examples of the poly(meth)acrylate resin, which is the resin having the poly(meth)acrylate structure in the molecule thereof, include a poly(meth)acrylate resin having a hydroxy group, a poly(meth)acrylate resin having a phenolic hydroxy group, a poly(meth)acrylate resin having a carboxy group, a poly(meth)acrylate resin having an acid anhydride group, a poly(meth)acrylate resin having an epoxy group, a poly(meth)acrylate resin having an isocyanate group, and a poly(meth)acrylate resin having a urethane group.

Specific Examples of the poly(meth)acrylate resin include: Teisan Resin "SG-70L", "SG-708-6", "WS-023", "SG-700AS", and "SG-280TEA" (these are acrylate ester copolymer resins having a carboxy group: acid value of 5 to 34 mgKOH/g; weight-average molecular weight of 400,000 to 900,000; Tg of −30 to 5° C.); "SG-80H", "SG-80H-3", and "SG-P3" (these are acrylate ester copolymer resins having an epoxy group: epoxy equivalent of 4,761 to 14,285 g/eq.; weight-average molecular weight of 350,000 to 850,000; Tg of 11 to 12° C.); and "SG-600TEA" and "SG-790" (both are acrylate ester copolymer resins having a hydroxy group: hydroxy value of 20 to 40 mgKOH/g; weight-average molecular weight of 500,000 to 1,200,000; Tg of −37 to −32° C.); all of the above resins being manufactured by Nagase Chemtex Corp.; "ME-2000" and "W-116.3" (both are acrylate ester copolymer resins having a carboxy group); "W-197C" (an acrylate ester copolymer resin having a hydroxy group); and "KG-25" and "KG-3000" (both are acrylate ester copolymer resins having an epoxy group); all of these resins being manufactured by Negami Chemical Industrial Co., Ltd.

It is preferable that the polyalkylene structure have a predetermined carbon atom number. Specifically, the carbon atom number of the polyalkylene structure is preferably 2 or more, and more preferably 3 or more, while especially preferably 5 or more; and preferably 15 or less, and more preferably 10 or less, while especially preferably 6 or less. The polyalkylene structure may be included in a main chain or in a side chain in the component (F).

It is preferable that the polyalkyleneoxy structure have a predetermined carbon atom number. Specifically, the carbon atom number of the polyalkyleneoxy structure is preferably 2 or more, and more preferably 3 or more, while especially preferably 5 or more; and preferably 15 or less, and more preferably 10 or less, while especially preferably 6 or less. The polyalkyleneoxy structure may be included in a main chain or in a side chain in the component (F).

Specific examples of the polyalkylene resin, which is the resin having a polyalkylene structure in the molecule thereof, and of the polyalkyleneoxy resin, which is the resin having a polyalkyleneoxy structure in the molecule thereof, include "PTXG-1000" and "PTXG-1800" manufactured by Asahi Kasei Fibers Corp.; "YX-7180" (a resin having an alkylene structure having an ether bond) manufactured by Mitsubishi Chemical Corp.; "EXA-4850-150", "EXA-4816", and "EXA-4822" manufactured by DIC Corp.; "EP-4000", "EP-4003", "EP-4010", and "EP-4011" manufactured by ADEKA Corp.; "BEO-60E" and "BPO-20E" manufactured by New Japan Chemical Co., Ltd.; and "YL7175" and "YL7410" manufactured by Mitsubishi Chemical Corp.

The polyisoprene structure may be included in a main chain or in a side chain in the component (F). Specific examples of the polyisoprene resin, which is the resin having the polyisoprene structure in the molecule thereof, include "KL-610" and "KL-613" manufactured by Kuraray Co., Ltd.

The polyisobutylene structure may be included in a main chain or in a side chain in the component (F). Specific examples of the polyisobutylene resin, which is the resin having the polyisobutylene structure in the molecule thereof, include "SIBSTAR-073T" (a styrene-isobutylene styrene triblock copolymer) and "SIBSTAR-042D" (a styrene-isobutylene diblock copolymer), both being manufactured by Kaneka Corp.

The polycarbonate structure may be included in a main chain or in a side chain in the component (F).

Preferable examples of the polycarbonate resin, which is the resin having the polycarbonate structure in the molecule thereof, include a polycarbonate resin having a hydroxy group, a polycarbonate resin having a phenolic hydroxy group, a polycarbonate resin having a carboxy group, a polycarbonate resin having an acid anhydride group, a polycarbonate resin having an epoxy group, a polycarbonate resin having an isocyanate group, and a polycarbonate resin having a urethane group.

Specific examples of the polycarbonate resin include "T6002" and "T6001" (both are polycarbonate diols) manufactured by Asahi Kasei Chemicals Corp.; and "C-1090", "C-2090", and "C-3090" (these are polycarbonate diols) manufactured by Kuraray Co., Ltd.

Preferable examples of the polycarbonate resin may also be a linear polyimide prepared from the raw materials, which are a polycarbonate terminated with hydroxy group(s), a diisocyanate compound and a polybasic acid or an acid anhydride thereof. This linear polyimide has a urethane structure and a polycarbonate structure. The content rate of the polycarbonate structure in this polyimide resin is preferably in the range of 60 to 95% by mass, while more preferably in the range of 75 to 85% by mass. For details of the polyimide resin, the specification of the International Publication No. 2016/129541, which is incorporated herein by reference in its entirety, can be taken into consideration; and the content thereof is incorporated into this specification.

Illustrative examples of the different and preferable polycarbonate resin include a polycarbonate type urethane (meth)acrylate obtained from a polycarbonate terminated with hydroxy group(s), a diisocyanate compound and a hydroxy-containing (meth)acrylate as raw materials. The polycarbonate type urethane (meth)acrylate has, in addition to a urethane structure and a polycarbonate structure, two or more (meth)acryloyl groups. Specific examples of the polycarbonate type urethane (meth)acrylate include "Art Resin UN-5500" manufactured by Negami Chemical Industrial Co., Ltd.

There is no particular restriction in the hydroxy-containing (meth)acrylate. Illustrative examples thereof include 2-hydroxyethyl (meth)acrylate, 2-hydroxypropyl (meth) acrylate, 2-hydroxybutyl (meth)acrylate, 4-hydroxybutyl (meth) acrylate, 2-hydroxy-3-phenoxypropyl (meth) acrylate, 2-hydroxy-3-acryloyloxypropyl methacrylate, 3-chloro-2-hydroxypropyl (meth)acrylate, 2-(2-ethoxyethoxy)ethyl (meth) acrylate, 1,4-cyclohexane dimethanol mono(meth)acrylate, and 2-(meth)acryloyloxyethyl-2-hydroxyethyl-phthalate.

The number-average molecular weight of the polycarbonate terminated with hydroxy group(s) is preferably in the range of 500 to 50,000, while more preferably in the range of 1,000 to 35,000. The weight-average molecular weight of the polycarbonate terminated with hydroxy group(s) is preferably in the range of 500 to 50,000, while more preferably in the range of 1,000 to 35,000. The hydroxy equivalent of the polycarbonate terminated with hydroxy group(s) is preferably in the range of 250 to 1,250 g/eq.

It is preferable that the component (F) further have an imide structure. The imide structure included therein can enhance the heat resistance of the component (F), and thus, it can effectively enhance the crack resistance.

Although the structure of the component (F) may be any of linear, branched, and cyclic, it is preferably linear.

Preferably, the component (F) includes an elastomer having an active group capable of reacting with (B) the epoxy resin. This active group may include a group expressing its reactivity by being heated. When the component (F) has a functional group, a mechanical strength of a cured product of the resin composition can be enhanced.

Illustrative examples of the active group include a carboxy group, a hydroxy group (preferably a phenolic hydroxy group), an acid anhydride group, an epoxy group, an isocyanate group, and a urethane group. Among these, from a viewpoint to clearly obtain the effects of the present invention, preferable active groups are one or more active groups selected from a hydroxy group (preferably a phenolic hydroxy group), an acid anhydride group, an epoxy group, an isocyanate group, and a urethane group, while a phenolic hydroxy group is especially preferable. The elastomer having the active group such as a phenolic hydroxy group has a function of curing (B) the epoxy resin, similarly to (C-1) the epoxy curing agent.

It is preferable that the component (F) include an elastomer having a phenolic hydroxy group such as a polybutadiene resin having a phenolic hydroxy group, a poly(meth) acrylate resin having a phenolic hydroxy group, and a polycarbonate resin having a phenolic hydroxy group, while the polybutadiene resin having a phenolic hydroxy group is especially preferable.

The component (F) may be used singly or as a combination of two or more of these elastomers.

From a viewpoint to express flexibility, it is preferable that the component (F) have a high molecular weight.

Specifically, the number-average molecular weight (Mn) of the component (F) is preferably 4,000 or more, more preferably 4,500 or more, and still more preferably 5,000 or more, while especially preferably 5,500 or more; and preferably 100,000 or less, and more preferably 95,000 or less, while especially preferably 90,000 or less. The number-average molecular weight Mn of the component (F) is the number-average molecular weight, in terms of polystyrene, measured by means of GPC (gel permeation chromatography).

From a viewpoint to obtain flexibility, the weight-average molecular weight (Mw) of the component (F) is preferably in the range of 5,500 to 100,000, more preferably in the range of 10,000 to 90,000, while still more preferably in the range of 15,000 to 80,000. The weight-average molecular weight of the component (F) is a weight-average molecular weight in terms of the converted value to polystyrene obtained by measurement with a gel permeation chromatography (GPC) method.

When the component (F) has a functional group, a functional equivalent of the component (F) is preferably 100 g/eq. or more, more preferably 200 g/eq. or more, and still more preferably 300 g/eq. or more, while especially preferably 400 g/eq. or more; and preferably 50,000 g/eq. or less, more preferably 30,000 g/eq. or less, and still more preferably 10,000 g/eq. or less, while especially preferably 5,000 g/eq. or less. The functional equivalent is the weight (g) of the resin that includes 1 g equivalent of a functional group. For example, the epoxy equivalent may be measured in accordance with JIS K7236. For example, the hydroxy equivalent may be calculated by dividing a molecular weight of KOH with the hydroxy value measured in accordance with JIS K1557-1.

The glass transition temperature (Tg) of the component (F) is, for example, 30° C. or lower, while preferably 0° C. or lower.

Although the content of (F) the elastomer in the resin composition is not particularly restricted, the content is preferably 80% or less by mass, more preferably 60% or less by mass, still more preferably 50% or less by mass, and far still more preferably 40% or less by mass, while especially preferably 35% or less by mass, on the basis of 100% by mass of nonvolatile components in the resin composition. The lower limit of the content of (F) the elastomer in the resin composition is not particularly restricted; this can be, for example, 0% or more by mass, 0.1% or more by mass, 1% or more by mass, 5% or more by mass, 10% or more by mass, 15% or more by mass, and 20% or more by mass, on the basis of 100% by mass of nonvolatile components in the resin composition.

(G) Thermoplastic Resin

The resin composition according to the present invention can include (G) the thermoplastic resin as the arbitrary component. Illustrative examples of (G) the thermoplastic resin include a phenoxy resin, a polyvinyl-acetal resin, a polyolefin resin, a polyimide resin, a polyamide-imide resin, a polyether-imide resin, a polysulfone resin, a polyethersulfone resin, a polyether-ether-ketone resin, and a polyester resin, while the phenoxy resin is preferable. These thermoplastic resins may be used singly or as a combination of two or more of them. Here, (G) the thermoplastic resin is the component that does not belong to (F) the elastomer.

The weight-average molecular weight of (G) the thermoplastic resin is preferably 38,000 or more, and more preferably 40,000 or more, while still more preferably 42,000 or more. The upper limit thereof is preferably 100,000 or less, and more preferably 70,000 or less, while still more preferably 60,000 or less. The weight-average molecular weight of (G) the thermoplastic resin is measured by a gel permeation chromatography (GPC) method (in terms of polystyrene). Specifically, the weight-average molecular weight of (G) the thermoplastic resin in terms of polystyrene is calculated by using a calibration curve of a standard polystyrene, measured with a measurement instrument of LC-9A/RID-6A manufactured by Shimadzu Corp., columns of Shodex K-800P/K-804L/K-804L manufactured by Showa Denko K. K., and a moving phase of chloroform and the like, at 40° C. as the column temperature.

Illustrative examples of the phenoxy resin include phenoxy resins having one or more skeletons selected from the group consisting of a bisphenol A skeleton, a bisphenol F skeleton, a bisphenol S skeleton, a bisphenol acetophenone skeleton, a novolak skeleton, a biphenyl skeleton, a fluorene skeleton, a cyclopentadiene skeleton, a norbornene skeleton, a naphthalene skeleton, an anthracene skeleton, an adamantane skeleton, a terpene skeleton, and a trimethyl cyclohexane skeleton. The terminal of the phenoxy resin may be any functional group such as a phenolic hydroxy group, and an epoxy group. The phenoxy resin may be used singly or as a mixture of two or more of these resins. Specific examples of the phenoxy resin include "1256" and "4250" (both are the phenoxy resins having a bisphenol A skeleton), "YX8100" (a phenoxy resin having a bisphenol S skeleton), and "YX6954" (a phenoxy resin having a bisphenol acetophenone skeleton), these resins being manufactured by Mitsubishi Chemical Corp., as well as "FX280" and "FX293" both being manufactured by Nippon Steel Chemical & Materials Co., Ltd.), and "YX7200B35", "YL7500BH30", "YX6954BH30", "YX7553", "YX7553BH30", "YL7769BH30", "YL6794", "YL7213", "YL7290", and "YL7482", these resins being manufactured by Mitsubishi Chemical Corp.

Illustrative examples of the polyvinyl-acetal resin include a polyvinyl-formal resin and a polyvinyl-butyral resin, while a polyvinyl-butyral resin is preferable. Specific examples of the polyvinyl-acetal resin include: "Denka Butyral 4000-2", "Denka Butyral 5000-A", "Denka Butyral 6000-C", and "Denka Butyral 6000-EP", these resins being manufactured by Denka Co., Ltd.; and Eslec BH Series, BX Series (for example, BX-5Z), KS Series (for example, KS-1), BL series, and BM Series, these resins being manufactured by Sekisui Chemical Co., Ltd.

Specific examples of the polyimide resin include "Rika Coat SN20" and "Rika Coat PN20", both being manufactured by New Japan Chemical Co., Ltd. Specific examples of the polyimide resin also include modified polyimides such as a linear polyimide obtained by reacting a bifunctional polybutadiene terminated with hydroxy groups, a diisocyanate compound, and a tetrabasic acid anhydride (a polyimide described in Japanese Patent Laid-open No. 2006-37083, which is incorporated herein by reference in its entirety), and polyimides having a polysiloxane skeleton (polyimides described in Japanese Patent Laid-open No. 2002-12667 and Japanese Patent Laid-open No. 2000-319386, which are incorporated herein by reference in their entireties).

Specific examples of the polyamide-imide resin include "Vylomax HR11NN" and "Vylomax HR16NN", both being manufactured by Toyobo Co., Ltd. Specific examples of the polyamide-imide resin also include modified polyamide imides such as "KS9100", and "KS9300" (both are polyamide imides having a polysiloxane skeleton) manufactured by Hitachi Chemical Co., Ltd.

Specific examples of the polyether-ether-ketone resin include "Sumiploy K" manufactured by Sumitomo Chemical Co., Ltd. Specific examples of the polyether-imide resin include "ULTEM" manufactured by GE Plastics Inc.

Specific examples of the polysulfone resin include Polysulfone "P1700" and "P3500" manufactured by Solvay Advanced Polymers LLC.

Illustrative examples of the polyolefin resin include: low-density polyethylene, ultralow-density polyethylene, and high-density polyethylene, as well as ethylenic copolymer resins such as an ethylene-vinyl acetate copolymer, an ethylene-ethyl acrylate copolymer, and an ethylene-methyl acrylate copolymer; and polyolefin type elastomers such as polypropylene and ethylene-propylene block copolymer.

Illustrative examples of the polyester resin include a polyethylene terephthalate resin, a polyethylene naphthalate resin, a polybutylene terephthalate resin, a polybutylene naphthalate resin, a polytrimethylene terephthalate resin, a polytrimethylene naphthalate resin, and a polycyclohexanedimethyl terephthalate resin.

Among these, the phenoxy resin is preferable as (G) the thermoplastic resin. Therefore, the phenoxy resin is preferable as the preferable thermoplastic resin, and the phenoxy resin having a weight-average molecular weight of 40,000 or more is especially preferable.

Although the content of (G) the thermoplastic resin in the resin composition is not particularly restricted, the content is preferably 30% or less by mass, more preferably 10% or less by mass, still more preferably 5% or less by mass, and far still more preferably 3% or less by mass, while especially preferably 1% or less by mass, on the basis of 100% by mass of nonvolatile components in the resin composition. The lower limit of the content of (G) the thermoplastic resin in the resin composition is not particularly restricted; this can be, for example, 0% or more by mass, 0.01% or more by mass, 0.1% or more by mass, 0.3% or more by mass, and 0.5% or more by mass, on the basis of 100% by mass of nonvolatile components in the resin composition.

(H) Other Additives

The resin composition according to the present invention may further include arbitrary additives as the non-volatile components. Illustrative examples of the additive like this include: organic metal compounds such as an organic copper compound, an organic zinc compound, and an organic cobalt compound; colorants such as phthalocyanine blue, phthalocyanine green, iodine green, diazo yellow, crystal violet, titanium oxide, and carbon black; polymerization inhibitors such as hydroquinone, catechol, pyrogallol, and phenothiazine; leveling agents such as a siloxane type leveling agent and an acrylic polymer type leveling agent; thickeners such as bentone and montmorillonite; antifoaming agents such as a silicone type antifoaming agent, an acrylic antifoaming agent, a fluorine type antifoaming agent, and a vinyl resin type antifoaming agent; UV absorbers such as a benzotriazole type UV absorber; adhesion enhancers such as a urea silane; adhesion assisting agents such as a triazole type adhesion assisting agent, a tetrazole type adhesion assisting agent, and a triazine type adhesion assisting agent; antioxidants such as a hindered phenol type antioxidant and a hindered amine type antioxidant; fluorescent whitening agents such as a stilbene derivative; and surfactants such as a fluorine type surfactant and a silicone type surfactant. These additives may be used singly or as a combination of two or more of them with an arbitrary ratio. The contents of (H) the other additives may be readily determined by a person ordinarily skilled in the art.

(I) Organic Solvent

The resin composition according to the present invention may further include, in addition to the non-volatile components described above, an arbitrary organic solvent as a volatile component. Heretofore known solvents may be arbitrarily used as (I) the organic solvent without any particular restriction. Illustrative examples of (I) the organic solvent include: ketone type solvents such as acetone, methyl ethyl ketone, methyl isobutyl ketone, and cyclohexanone; ester type solvents such as methyl acetate, ethyl acetate, butyl acetate, isobutyl acetate, isoamyl acetate, methyl propionate, ethyl propionate, and γ-butyrolactone; ether type solvents such as tetrahydropyran, tetrahydrofuran, 1,4-dioxane, diethyl ether, diisopropyl ether, dibutyl ether, and diphenyl ether; alcohol type solvents such as methanol, ethanol, propanol, butanol, and ethylene glycol; ether ester type solvents such as 2-ethoxyethyl acetate, propylene glycol monomethyl ether acetate, diethylene glycol monoethyl ether acetate, ethyl diglycol acetate, γ-butyrolactone, and methyl methoxypropionate; ester alcohol type solvents such as methyl lactate, ethyl lactate, and methyl 2-hydroxyisobutyrate; ether alcohol type solvents such as 2-methoxypropanol, 2-methoxyethanol, 2-ethoxyethanol, propylene glycol monomethyl ether, and diethylene glycol monobutyl ether (butyl carbitol); amide type solvents such as N,N-dimethylformamide, N,N-dimethylacetamide, and N-methyl-2-pyrrolidone; sulfoxide type solvents such as dimethyl sulfoxide; nitrile type solvents such as acetonitrile, and propionitrile; aliphatic hydrocarbon type solvents such as hexane, cyclopentane, cyclohexane, and methylcyclohexane; and aromatic hydrocarbon type solvents such as benzene, toluene, xylene, ethylbenzene, and trimethylbenzene. (I) The organic solvents may be used singly or as a combination of two or more of them with an arbitrary ratio.

In one embodiment, the content of (I) the organic solvent is not particularly restricted. This can be, for example, 60% or less by mass, 40% or less by mass, 30% or less by mass, 20% or less by mass, 15% or less by mass, or 10% or less by mass, on the basis of 100% by mass of the entire components in the resin composition.

Production Method of the Resin Composition

The resin composition according to the present invention may be produced, for example, by adding and mixing, in an arbitrary reacting vessel, (A) the hollow organic polymer particle, (B) the epoxy resin, (C) the curing agent, and as needed (A') the non-hollow organic polymer particle, as needed (D) the inorganic filler, as needed (E) the flame retardant, as needed (F) the elastomer, as needed (G) the thermoplastic resin, and as needed (H) the other additives, and as needed (I) the organic solvent, in an arbitrary order and/or partially or all at once. During the addition and mixing process of these components, the temperature of them can be arbitrarily set; and temporarily or entirely in this process, they may be heated and/or cooled. During the addition and mixing process of these components, they may be stirred or shaken. During the addition and mixing process, or after this process, the resin composition may be stirred by using a stirring apparatus such as, for example, a mixer so as to uniformly disperse the composition.

Characteristics of the Resin Composition

Because the resin composition according to the present invention includes (A) the hollow organic polymer particle, a cured product having a superior smear removal property can be obtained. Also, in one embodiment, the cured product of the resin composition according to the present invention can be provided with a superior reflow resistance. Furthermore, in one embodiment, the cured product of the resin composition according to the present invention can suppress a warp at the time of curing, and a crack. Furthermore, in one embodiment, the cured product of the resin composition according to the present invention can be provided with superior electric characteristics.

The cured product of the resin composition according to the present invention has a superior smear removal property. Therefore, in one embodiment, for example, when a roughening process is carried out after formation of a via hole in the cured product of the resin composition in the way as described in Test Example 3 to be described later, a maximum smear length of preferably less than 5 µm, and more preferably less than 3 µm, can be obtained upon measurement of the maximum smear length. Here, the maximum smear length is a maximum length of a smear from a circumference of a bottom face in the via hole to a center of this circle.

In one embodiment, the cured product of the resin composition according to the present invention has superior electric characteristics. Therefore, a dielectric loss tangent of the cured product of the resin composition according to the present invention measured at 5.8 GHz and 23° C. in the way as described in Test Example 1 to be described later can be preferably 0.020 or less, more preferably 0.017 or less, and still more preferably 0.015 or less, while especially preferably 0.013 or less. Also, in one embodiment, a relative dielectric constant of the cured product of the resin composition measured at 5.8 GHz and 23° C. in the way as described in Test Example 1 to be described later can be preferably 5.0 or less, more preferably 4.0 or less, and still more preferably 3.5 or less, while especially preferably 3.0 or less.

In one embodiment, the cured product of the resin composition according to the present invention can be provided with a superior reflow resistance. Therefore, for example, as described in Test Example 2 to be described later, even when a specimen of the cured product of the resin composition that is cut to a size of 100 mm×50 mm is passed 10 times through a reflow apparatus that reproduces a solder reflow temperature of 260° C. as a peak temperature, abnormality in the specimen can be suppressed; thus, under a specific one embodiment, abnormality can be avoided in the specimen.

In one embodiment, in the resin composition according to the present invention, a warp at the time of curing can be suppressed. Therefore, for example, when a warp of a metal foil that is attached with a cured layer is measured in the way as described in Test Example 4 to be described later, a warp amount thereof can be preferably less than 10 mm, more preferably less than 5 mm, and still more preferably less than 3 mm, while especially preferably less than 1 mm.

In one embodiment, in the resin composition according to the present invention, generation of a crack can be suppressed. Therefore, for example, when 100 of the copper pad portion in a circuit board after roughening process are observed in the way as described in Test Example 5 to be described later, the number of the cracks generated in the resin composition layer can be 20 or less, and more preferably 15 or less, while still more preferably 10 or less.

Use of the Resin Composition

The resin composition according to the present invention can be suitably used as the resin composition for an insulation use, especially as the resin composition to form an insulating layer. Specifically, this can be suitably used as the resin composition to form an insulating layer on which a conductive layer (including a rewiring layer) is to be formed (resin composition for forming of an insulating layer to form a conductive layer). In addition, this can be suitably used as the resin composition to form an insulating layer of a printed wiring board to be described later (resin composition for forming of an insulating layer of a printed wiring board). In addition, the resin composition according to the present invention may be widely used in the use fields requiring a resin composition, such fields as a resin sheet, a sheet-like laminate material such as a prepreg, a solder resist, an under filler, a die bonding material, a semiconductor sealing material, a hole-filling resin, and a component-burying resin.

For example, in the case that a semiconductor chip package is produced by way of the following processes (1) to (6), the resin composition according to the present invention may also be suitably used as the resin composition for forming of a rewiring forming layer, for forming of an insulating layer to form the rewiring layer (a resin composition for forming of a rewiring forming layer), and for sealing of a semiconductor chip (a resin composition for sealing of a semiconductor chip). When a semiconductor chip package is produced, a rewiring layer may be further formed on a sealing layer.

(1) Process to laminate a temporarily fixed film on a substrate, (2) process to temporarily fix a semiconductor chip onto the temporarily fixed film, (3) process to form a sealing layer on the semiconductor chip, (4) process to remove the substrate and the temporarily fixed film from the semiconductor chip, (5) process to form a rewiring forming layer as an insulating layer on a surface from which the substrate of the semiconductor chip and the temporarily fixed film have been removed, and (6) process to form a rewiring layer as a conductive layer on the rewiring forming layer.

The resin composition according to the present invention can form an insulating layer that is superior in the component-burying property, so that this can be suitably used also in the case where a printed wiring board is a component-incorporated circuit board.

Sheet-Like Laminate Material

Although the resin composition according to the present invention may also be used in a varnish state so as to be applied, industrially, in general, it is preferable to use this in the form of a sheet-like laminate material containing the resin composition.

The sheet-like laminate material is preferably a resin sheet and a prepreg as described below.

In one embodiment, the resin sheet comprises a support and a resin composition layer formed on the support, in which the resin composition layer is formed of the resin composition according to the present invention.

In view of the thinning of a printed wiring board, and providing a cured product having a superior insulating property even if the cured product of this resin composition is a thin film, the thickness of the resin composition layer is preferably 50 μm or less, while more preferably 40 μm or less. The lower limit of the thickness of the resin composition layer is not particularly restricted, and it can be usually 5 μm or more, 10 μm or more, or the like.

Illustrative examples of the support include a film formed of a plastic material, metal foil, and a releasing paper. Among them, a film formed of a plastic material and metal foil are preferable.

In the case that the film formed of a plastic material is used as the support, illustrative examples of the plastic material include polyesters such as polyethylene terephthalate (hereinafter, this is also simply called "PET"), and polyethylene naphthalate (hereinafter, this is also simply called "PEN"); polycarbonate (hereinafter, this is also simply called "PC"); acrylic resins such as polymethyl methacrylate (PMMA); a cyclic polyolefin; triacetyl cellulose (TAC); polyether sulfide (PES); polyether ketone; and polyimide. Among them, polyethylene terephthalate and polyethylene naphthalate are preferable, while inexpensive polyethylene terephthalate is especially preferable.

In the case that metal foil is used as the support, illustrative examples of the metal foil include copper foil and aluminum foil, and copper foil is preferable. As to the copper foil, the foil formed of a copper single metal or an alloy of copper with other metal (for example, tin, chromium, silver, magnesium, nickel, zirconium, silicon, titanium, and the like) may be used.

The support may be subjected to a mat treatment, a corona treatment, or an antistatic treatment on the surface to be bonded with the resin composition layer.

As to the support, a releasing layer-attached support having a releasing layer on the surface to be bonded with the resin composition layer may be used. The releasing agent to be used in the releasing layer of the releasing layer-attached support may be one or more releasing agents selected from the group consisting of, for example, an alkyd resin, a polyolefin resin, a urethane resin, and a silicone resin. A commercially available good may also be used as the releasing layer-attached support. Illustrative examples thereof include a PET film having a releasing layer mainly formed of an alkyd resin type releasing agent, such as "SK-1", "AL-5", and "AL-7" manufactured by Lintech Corp.; "Lumirror T60" manufactured by Toray Industries; "Purex" manufactured by Teijin Ltd.; and "Unipeel" manufactured by Unitika Ltd.

The thickness of the support is not particularly restricted, and it is preferably in the range of 5 to 75 μm, while more preferably in the range of 10 to 60 μm. When the releasing layer-attached support is used, total thickness of the releasing layer-attached support is preferably within this range.

In one embodiment, the resin sheet may further include an arbitrary layer, if necessary. The arbitrary layer may be, for example, among others, a protection film or the like, which is similar to the support, formed on the surface of the resin composition layer not bonded with the support (namely, the surface opposite to the support). The thickness of the protection film is not particularly restricted, and it is, for example, in the range of 1 to 40 μm. By providing the protection film, the resin composition layer may be prevented from attachment of dirt and the like as well as from a scar on the surface thereof.

The resin sheet may be produced, for example, as follows. The resin composition in a liquid state as it is, or a resin varnish prepared by dissolving the resin composition into an organic solvent is applied onto a support by means of a die coater or the like; and then, this is dried to form the resin composition layer.

Organic solvents the same as those explained as the component in the resin composition may be used. These organic solvents may be used singly or as a combination of two or more of them.

Drying may be carried out by a heretofore known method such as heating, and blowing of a hot air. The drying condition is not particularly restricted. Drying is carried out so as to bring the content of the organic solvent in the resin composition layer to 10% by mass or less, while preferably to 5% by mass or less. In the case that the resin composition containing an organic solvent with the amount, for example, in the range of 30 to 60% by mass, or the resin varnish containing an organic solvent with the same amount is used, the resin composition layer may be formed by drying thereof at 50 to 150° C. for 3 to 10 minutes, although these conditions are different depending on the boiling point of the organic solvent contained in the resin composition or in the resin varnish.

The resin sheet can be rolled up so as to be stored. In the case that the resin sheet has the protection film, the resin sheet can be used after the protection film is removed.

In one embodiment, a prepreg is formed by impregnating a sheet-like fibrous substrate with the resin composition according to the present invention.

The sheet-like fibrous substrate to be used in the prepreg is not particularly restricted. Those usually used as the substrate for a prepreg, such as a glass cloth, an aramid unwoven cloth, and a liquid crystal polymer unwoven cloth may be used. In view of the thinning of a printed wiring board, the thickness of the sheet-like fibrous substrate is preferably 50 μm or less, more preferably 40 μm or less, and still more preferably 30 μm or less, while especially preferably 20 μm or less. The lower limit of the thickness of the sheet-like fibrous substrate is not particularly restricted. Usually, the thickness thereof is 10 μm or more.

The prepreg may be produced by a heretofore known method such as a hot melt method, and a solvent method.

The thickness of the prepreg can be made within the same range as that of the resin composition layer in the resin sheet described above.

The sheet-like laminate material according to the present invention may be preferably used to form an insulating layer in a printed wiring board (a material for an insulating layer in a printed wiring board), while more preferably to form an interlayer insulating layer in a printed wiring board (a material for an interlayer insulating layer in a printed wiring board).

Printed Wiring Board

The printed wiring board according to the present invention includes an insulating layer formed of a cured product obtained by curing the resin composition according to the present invention.

The printed wiring board may be produced, for example, by using the resin sheet described above by a method including following processes (I) and (II):

(I) process to laminate a resin sheet on an inner layer substrate so as to bond a resin composition layer of the resin sheet with the inner layer substrate, and (II) process to cure the resin composition layer (for example, thermal cure) thereby forming an insulating layer.

"Inner layer substrate" used in the process (I) is a component to become a substrate of a printed wiring board; and illustrative examples thereof include a glass epoxy substrate, a metal substrate, a polyester substrate, a polyimide substrate, a BT resin substrate, and a thermosetting polyphenylene ether substrate. This substrate may have a conductive layer on one side or both sides thereof; and this conductive layer may be pattern-processed. The inner layer substrate having a conductive layer (circuit) on one side or both sides of the substrate can also be called "inner layer circuit substrate". An intermediate product with which an insulating layer and/or a conductive layer is to be formed at the time of producing a printed wiring board is also included in the "inner layer substrate" according to the present invention. When the printed wiring board is a component-incorporated circuit board, an inner substrate incorporated with the component may be used.

Lamination of the resin sheet to the inner layer substrate may be carried out, for example, by hot-press adhesion of the resin sheet to the inner layer substrate from the support side thereof. Illustrative examples of the component for hot-press adhesion of the resin sheet to the inner layer substrate (hereinafter, this component is also called "hot-pressing component") include a heated metal plate (a SUS mirror plate and the like) and a heated metal roll (a SUS roll). At this time, it is preferable that the resin sheet is pressed not directly by the hot-pressing component but via an elastic material such as a heat-resistant rubber so that the resin sheet may sufficiently follow the surface irregularity of the inner layer substrate.

Lamination of the resin sheet to the inner layer substrate may be carried out by a vacuum lamination method. In the vacuum lamination method, the temperature of the hot-press adhesion is preferably in the range of 60 to 160° C., while more preferably in the range of 80 to 140° C. The pressure of the hot-press adhesion is preferably in the range of 0.098 to 1.77 MPa, while more preferably in the range of 0.29 to 1.47 MPa. The period of the hot-press adhesion is preferably in the range of 20 to 400 seconds, while more preferably in the range of 30 to 300 seconds. The lamination can be carried out under evacuated condition of preferably 26.7 hPa or less of the pressure.

Lamination may be carried out by using a commercially available vacuum laminator. Illustrative examples of the commercially available vacuum laminator include a vacuum pressure type laminator manufactured by Meiki Co., Ltd., and a vacuum applicator and a batch type vacuum pressure laminator, both being manufactured by Nikko-Materials Co., Ltd.

After the lamination, for example, the laminated resin sheet may be flattened by pressing the hot-pressing component from the side of the support thereof under a normal pressure (under an atmospheric pressure). The pressing conditions of the flattening process can be made as same as the hot-press adhesion conditions in the before-mentioned lamination. The flattening process may be carried out by using a commercially available laminator. The lamination and the flattening processes may be carried out continuously by using the commercially available vacuum laminator described above.

The support may be removed between the process (I) and the process (II), or after the process (II).

In the process (II), the resin composition layer is cured (for example, thermally cured) to form an insulating layer formed of a cured product of the resin composition. Curing conditions of the resin composition layer are not particularly restricted, so that the conditions usually used to form an insulating layer of a printed wiring board may be used.

Thermosetting conditions of the resin composition layer are different depending on the resin composition and the like. For example, the curing temperature is preferably in the range of 120 to 240° C., and more preferably in the range of 150 to 220° C., while still more preferably in the range of 170 to 210° C. The curing period can be preferably in the range of 5 to 120 minutes, and more preferably in the range of 10 to 100 minutes, while still more preferably in the range of 15 to 100 minutes.

Before the resin composition layer is thermally cured, the resin composition layer may be pre-heated at the temperature lower than the curing temperature. For example, prior to thermosetting of the resin composition layer, the resin composition layer may be pre-heated in the temperature range of 50 to 120° C., and preferably in the range of 60 to 115° C., while more preferably in the range of 70 to 110° C., and for the period of 5 minutes or longer, preferably in the range of 5 to 150 minutes, and more preferably in the range of 15 to 120 minutes, while still more preferably in the range of 15 to 100 minutes.

In production of the printed wiring board, a process (III) to make a hole in the insulating layer, a process (IV) to roughen the insulating layer, and a process (V) to form a conductive layer may be further carried out. The processes from (III) to (V) may be carried out in accordance with various methods heretofore known to a person ordinarily skilled in the art in production of a printed wiring board. In the case that the support is removed after the process (II), removal of the support may be carried out between the process (II) and the process (III), or between the process (III) and the process (IV), or between the process (IV) and the process (V). As needed, processes (II) to (V), i.e., formation of the insulating layer and the conductive layer, may be repeated to form a multilayer wiring board.

In other embodiment, the printed wiring board according to the present invention may be produced by using the above-mentioned prepreg. The production method thereof is basically the same as the production method by using the resin sheet.

In the process (III), a hole is created in the insulating layer. With this, a hole such as a via hole, and a through hole can be formed in the insulating layer. The process (III) may be carried out by using, for example, a drill, a laser, a plasma, or the like in accordance with composition and the like of the resin composition used to form the insulating layer. The size and shape of the hole may be arbitrarily determined in accordance with a design of the printed wiring board.

In the process (IV), the insulating layer is roughened. Usually, in the process (IV), a smear is removed as well. The procedure and condition of the roughening process are not particularly restricted, so that heretofore known procedure and condition usually used to form an insulating layer of a printed wiring board can be used. The roughening process of the insulating layer may be carried out, for example, by a method in which a swelling treatment with a swelling liquid, a roughening treatment with an oxidant, and a neutralizing treatment with a neutralizing solution are carried out in this order.

The swelling liquid to be used in the roughening process is not particularly restricted, and illustrative examples of the swelling liquid include an alkaline solution and a surfactant solution. Among them, an alkaline solution is preferable, while a sodium hydroxide solution and a potassium hydroxide solution are more preferable as the alkaline solution. Illustrative examples of the swelling liquid that is commercially available include "Swelling Dip Securiganth P" and "Swelling Dip Securiganth SBU", both being manufactured by Atotech Japan Co., Ltd. The swelling treatment with the swelling liquid is not particularly restricted, and for example, can be carried out by soaking the insulating layer into the swelling liquid in the temperature range of 30 to 90° C. and for the period of 1 to 20 minutes. In view of suppressing the swelling of the resin in the insulating layer to a suitable level, it is preferable to soak the insulating layer into the swelling liquid in the temperature range of 40 to 80° C. and for the period of 5 to 15 minutes.

Oxidant to be used in the roughening process is not particularly restricted, and illustrative examples of the oxidant include an alkaline permanganate solution having potassium permanganate or sodium permanganate dissolved into a sodium hydroxide aqueous solution. The roughening process with an oxidant such as the alkaline permanganate solution may be carried out preferably by soaking the insulating layer into the oxidant solution heated to 60 to 100° C. for the period of 10 to 30 minutes. The concentration of the permanganate salt in the alkaline permanganate solution is preferably in the range of 5 to 10% by mass. Illustrative examples of the oxidant that is commercially available include alkaline permanganate solutions such as "Concentrate Compact CP", and "Dosing Solution Securiganth P", both being manufactured by Atotech Japan, Co., Ltd.

The neutralization solution to be used in the roughening process is preferably an acidic aqueous solution, and illustrative examples of the commercially available neutralization solution include "Reduction Solution Securiganth P" manufactured by Atotech Japan Co., Ltd.

Treatment with the neutralization solution can be carried out by soaking the surface treated with the roughening process by using the oxidant into the neutralization solution in the temperature range of 30 to 80° C. for the period of 5 to 30 minutes. In view of workability, it is preferable to soak the object treated with the roughening process by using the oxidant into the neutralization solution in the temperature range of 40 to 70° C. for the period of 5 to 20 minutes.

In one embodiment, the arithmetic average roughness (Ra) of the surface of the insulating layer after the roughening process is not particularly restricted, and it is preferably 500 nm or less, and more preferably 400 nm or less, while still more preferably 300 nm or less. The lower limit thereof is not particularly restricted, and it can be, for example, 1 nm or more, or 2 nm or more, or the like. The root mean square roughness (Rq) of the surface of the insulating layer after the roughening process is preferably 500 nm or less, and more preferably 400 nm or less, while still more preferably 300 nm or less. The lower limit thereof is not particularly restricted, and it can be, for example, 1 nm or more, or 2 nm or more, or the like. The arithmetic average roughness (Ra) and the root mean square roughness (Rq) of the surface of the insulating layer can be measured by using a non-contact type surface roughness meter.

In the process (V), a conductive layer is formed; the conductive layer is formed on the insulating layer. There is no particular restriction in the conductive material to be used in the conductive layer. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or a metal alloy layer. Illustrative examples of the metal alloy layer include layers formed of metal alloys of two or more metals selected from the group mentioned above (for example, nickel-chromium alloy, copper-nickel alloy, and copper-titanium alloy). Among them, in view of general applicability to formation of the conductive layer, cost, easy patterning, and the like, preferable are single metal layers of chromium, nickel, titanium, aluminum, zinc, gold, palladium, silver, or copper; and metal alloy layers of a nickel-chromium alloy, a copper-nickel alloy, and a copper-titanium alloy. Among them, more preferable are single metal layers of chromium, nickel, titanium, aluminum, zinc, gold, palladium, silver, or copper, or a metal alloy layer of a nickel-chromium alloy. A single metal layer of copper is still more preferable.

The conductive layer may be of a single layer structure or of a multiple layer structure that includes two or more laminated single metal layers or metal alloy layers formed of different metals or metal alloys. In the case that the conductive layer is of the multiple layer structure, the layer contacting with the insulating layer is preferably a single metal layer of chromium, zinc, or titanium, or a metal alloy layer of a nickel-chromium alloy.

The thickness of the conductive layer is generally in the range of 3 to 35 μm, while preferably in the range of 5 to 30 μm, although these values depend on the intended design of the printed wiring board.

In one embodiment, the conductive layer may be formed by plating. For example, the conductive layer having an intended wiring pattern may be formed by plating on the surface of the insulating layer by a conventional heretofore known technology such as a semi-additive method, and a full additive method. In view of convenience in the production thereof, it is preferable to form the conductive layer by a semi-additive method. Hereinafter, an example will be described in which the conductive layer is formed by a semi-additive method.

First, a plated seed layer is formed onto the surface of the insulating layer by electroless plating. Next, onto the plated seed layer thus formed, a mask pattern is formed so as to expose part of the plated seed layer in accordance with an intended wiring pattern. After a metal layer is formed by electroplating onto the plated seed layer thus exposed, the mask pattern is removed. Thereafter, an unnecessary plated seed layer is removed by etching or the like, so that the conductive layer having the intended wiring pattern can be formed.

In an alternative embodiment, the conductive layer may be formed by using metal foil. In the case that the conductive layer is formed by using metal foil, it is preferable to carry out the process (V) between the process (I) and the process (II). For example, after the process (I), the support is removed; and the metal foil is laminated on the surface of the resin composition layer thus exposed. Lamination of the metal foil with the resin composition layer may be carried out by a vacuum lamination method. The lamination conditions may be the same as those explained in the process (I). Next, the process (II) is carried out to form the insulating layer. Thereafter, by utilizing the metal foil on the insulating layer, the conductive layer having an intended wiring pattern can be formed by a conventional heretofore known technology such as a subtractive method, and a modified semi-additive method.

The metal foil may be produced by a heretofore known method such as an electrolysis method, and a rolling method. Illustrative examples of the metal foil that is commercially available include: HLP foil and JXUT-III foil, both being manufactured by JX Nippon Mining & Metals Corp.; and 3EC-III foil and TP-III foil, both being manufactured by Mitsui Mining & Smelting Co., Ltd.

Semiconductor Device

The semiconductor device according to the present invention includes the printed wiring board according to the present invention. The semiconductor device according to the present invention can be produced by using the printed wiring board according to the present invention. The semiconductor device may be various semiconductor devices to be supplied to electric products (for example, a computer, a mobile phone, a digital camera, and a television), vehicles (for example, a motor bike, an automobile, an electric train, a marine ship, and an airplane), and the like.

Other features of the invention will become apparent in the course of the following descriptions of exemplary embodiments which are given for illustration of the invention and are not intended to be limiting thereof.

EXAMPLES

In the explanation below, "parts" and "%" that are used to express quantities mean "parts by mass" and "% by mass", respectively, unless otherwise specifically mentioned.

Synthesis Example 1: Synthesis of Elastomer
(Butadiene Resin Having Phenolic Hydroxy Group)

Into a reaction vessel were charged 69 g of a bifunctional polybutadiene terminated with hydroxy groups ("G-3000"; manufactured by Nippon Soda Co., Ltd.; number-average molecular weight of 3000 and hydroxy equivalent of 1800 g/eq.), 40 g of an aromatic hydrocarbon type mixed solvent ("Ipzole 150"; manufactured by Idemitsu Petrochemical Co., Ltd.), and 0.005 g of dibutyltin laurate; and then, they were mixed so as to be uniformly dissolved. When the uniformity was attained, the temperature thereof was raised to 60° C. To this was added with stirring 8 g of isophorone diisocyanate ("IPDI"; manufactured by Evonik Degussa Japan Co., Ld.; isocyanate equivalent of 113 g/eq.); and then, the reaction was carried out for about 3 hours.

Next, to this reaction solution was added 23 g of a cresol novolak resin ("KA-1160"; manufactured by DIC Corp.; hydroxy equivalent of 117 g/eq.) and 60 g of ethyl diglycol acetate (manufactured by Daicel Corp.); and then, after the temperature of the resulting mixture was raised to 150° C. with stirring, the reaction was carried out for about 10 hours. By measurement with FT-IR, disappearance of the NCO peak at 2,250 cm$^{-1}$ was confirmed. Termination point of the reaction was judged when disappearance of the NCO peak was confirmed. Then, the reaction solution was cooled to a room temperature. Next, the reaction solution was filtrated through a 100-mesh filtration cloth to obtain an elastomer having butadiene structure and phenolic hydroxyl group (butadiene resin having a phenolic hydroxy group: non-volatile components 50% by mass). The number-average molecular weight of the elastomer was 5,900, and the glass transition temperature thereof was −7° C.

Synthesis Example 2: Synthesis of Hollow Styrene Particle

In accordance with the description of Example 2 in Japanese Patent Application Laid-open No. 2017-119843, which is incorporated herein by reference in its entirety, a styrene type hollow particle was obtained. The average particle diameter thereof was 8 μm with the porosity of 50% by volume.

Example 1

A mixture of 20 parts of a biphenyl type epoxy resin ("NC-3000-L"; manufactured by Nippon Kayaku Co., Ltd.; epoxy equivalent of about 269 g/eq.), 5 parts of an epoxy resin ("WHR-991S"; manufactured by Nippon Kayaku Co., Ltd.; epoxy equivalent of about 265 g/eq.), 50 parts of the elastomer obtained in Synthesis Example 1 (50% by mass of non-volatile components), 15 parts of a spherical silica ("UFP-30": manufactured by Denka Co., Ltd.; average particle diameter of 0.3 μm) whose surface was treated with an aminosilane type coupling agent ("KBM573"; manufactured by Shin-Etsu Chemical Co., Ltd.), 10 parts of a hollow styrene particle ("XX-5598Z"; manufactured by Sekisui Kasei Co., Ltd.; average particle diameter of 0.5 μm; porosity of 35% by volume), 5 parts of a flame retardant ("HCA-HQ-HST"; manufactured by Sanko Co., Ltd.; 10-(2,5-dihydroxyphenyl)-9,10-dihydro-9-oxa-10-phosphaphenanthlene-10-oxide; average particle diameter of 1.5 μm), 2 parts of 1-benzyl-2-phenylimidazole ("1B2PZ"; manufactured by Shikoku Chemicals Corp.; a methyl ethyl ketone solution of 10% by mass of a solid portion) as a curing accelerator, and 25 parts of methyl ethyl ketone was uniformly dispersed by a high speed rotation mixer to obtain a resin composition.

Example 2

A resin composition was prepared in the same manner as Example 1 except that the use amount of the hollow styrene particle ("XX-5598Z"; manufactured by Sekisui Kasei Co., Ltd.; average particle diameter of 0.5 μm; porosity of 35% by volume) was changed from 10 parts to 3 parts.

Example 3

A resin composition was prepared in the same manner as Example 1 except that the use amount of the spherical silica ("LFP-30"; manufactured by Denka Co., Ltd.; average particle diameter of 0.3 μm) whose surface was treated with an aminosilane type coupling agent ("KBM573"; manufactured by Shin-Etsu Chemical Co., Ltd.) was changed from 15 parts to 10 parts, and that the use amount of the hollow styrene particle ("XX-5598Z"; manufactured by Sekisui Kasei Co., Ltd.; average particle diameter of 0.5 μm; porosity of 35% by volume) was changed from 10 parts to 35 parts.

Example 4

A resin composition was prepared in the same manner as Example 3 except that the spherical silica ("UFP-30"; manufactured by Denka Co., Ltd.; average particle diameter of 0.3 µm) whose surface was treated with an aminosilane type coupling agent ("KBM573"; manufactured by Shin-Etsu Chemical Co., Ltd.) was not used.

Example 5

A resin composition was prepared in the same manner as Example 1 except that the use amount of the hollow styrene particle ("XX-5598Z"; manufactured by Sekisui Kasei Co., Ltd.; average particle diameter of 0.5 µm; porosity of 35% by volume) was changed from 10 parts to 5 parts and that 5 parts of a core-shell type rubber particle ("IM401-4-14"; manufactured by Aica Kogyo Co., Ltd.; the core portion is formed of polybutadiene and the shell portion is formed of a copolymer of styrene and divinyl benzene) was additionally used.

Example 6

A resin composition was prepared in the same manner as Example 1 except that 10 parts of the hollow styrene particle obtained in Synthesis Example 2 (average particle diameter of 8 µm and the porosity of 50% by volume) was used in place of 10 parts by mass of the hollow styrene particle ("XX-5598Z"; manufactured by Sekisui Kasei Co., Ltd.; average particle diameter of 0.5 µm; porosity of 35% by volume).

Example 7

A resin composition was prepared in the same manner as Example 1 except that the use amount of the biphenyl type epoxy resin ("NC-3000-L"; manufactured by Nippon Kayaku Co., Ltd.; epoxy equivalent of about 269 g/eq.) was changed from 20 parts to 10 parts and that 10 parts of a liquid bisphenol A type epoxy resin ("jER828EL"; manufactured by Mitsubishi Chemical Corp.; epoxy equivalent of about 180 g/eq.) was additionally used.

Example 8

A resin composition was prepared in the same manner as Example 1 except that 10 parts of the liquid bisphenol A type epoxy resin ("jER828EL"; manufactured by Mitsubishi Chemical Corp.; epoxy equivalent of about 180 g/eq.) and 10 parts of a bisphenol AF type epoxy resin ("YX7760"; manufactured by Mitsubishi Chemical Corp.; epoxy equivalent of about 238 g/eq.) were used in place of 20 parts of the biphenyl type epoxy resin ("NC-3000-L"; manufactured by Nippon Kayaku Co., Ltd.; epoxy equivalent of about 269 g/eq.).

Example 9

A resin composition was prepared in the same manner as Example 1 except that 10 parts of the liquid bisphenol A type epoxy resin ("jER828EL"; manufactured by Mitsubishi Chemical Corp.; epoxy equivalent of about 180 g/eq.) and 10 parts of a dicyclopentadiene type epoxy resin ("HP-7200L"; manufactured by DIC Corp.; epoxy equivalent of about 250 g/eq.) were used in place of 20 parts of the biphenyl type epoxy resin ("NC-3000-L"; manufactured by Nippon Kayaku Co., Ltd.; epoxy equivalent of about 269 g/eq.).

Example 10

A resin composition was prepared in the same manner as Example 1 except that 10 parts of the liquid bisphenol A type epoxy resin ("jER828EL"; manufactured by Mitsubishi Chemical Corp.; epoxy equivalent of about 180 g/eq.) and 10 parts of a modified naphthalene type epoxy resin ("ESN-475V"; manufactured by Nippon Steel Chemical & Materials Co., Ltd.; epoxy equivalent of about 330 g/eq.) were used in place of 20 parts of the biphenyl type epoxy resin ("NC-3000-L"; manufactured by Nippon Kayaku Co., Ltd.; epoxy equivalent of about 269 g/eq.).

Example 11

A resin composition was prepared in the same manner as Example 1 except that 7 parts of a naphthalene type epoxy resin ("HP-4032SS"; manufactured by DIC Corp.; epoxy equivalent of about 144 g/eq.), 3 parts of a naphthalene type polyfunctional epoxy resin ("HP-4710"; manufactured by DIC Corp.; epoxy equivalent of about 170 g/eq.), and 10 parts of a naphthylene ether type epoxy resin ("HP-6000"; manufactured by DIC Corp.; epoxy equivalent of about 250 g/eq.) were used in place of 20 parts of the biphenyl type epoxy resin ("NC-3000-L"; manufactured by Nippon Kayaku Co., Ltd.; epoxy equivalent of about 269 g/eq.).

Example 12

A resin composition was prepared in the same manner as Example 1 except that 10 parts of the naphthalene type epoxy resin ("HP-4032SS"; manufactured by DIC Corp.; epoxy equivalent of about 144 g/eq.) and 10 parts of the naphthylene ether type epoxy resin ("HP-6000"; manufactured by DIC Corp.; epoxy equivalent of about 250 g/eq.) were used in place of 20 parts of the biphenyl type epoxy resin ("NC-3000-L"; manufactured by Nippon Kayaku Co., Ltd.; epoxy equivalent of about 269 g/eq.).

Example 13

A resin composition was prepared in the same manner as Example 7 except that 30 parts of a spherical silica ("SOC2" manufactured by Admatechs Co., Ltd.; average particle diameter of 0.5 µm) whose surface was treated with the aminosilane type coupling agent ("KBM573"; manufactured by Shin-Etsu Chemical Co., Ltd.) was used in place of 15 parts of the spherical silica ("UFP-30"; manufactured by Denka Co., Ltd.; average particle diameter of 0.3 µm) whose surface was treated with an aminosilane type coupling agent ("KBM573"; manufactured by Shin-Etsu Chemical Co., Ltd.).

Example 14

A resin composition was prepared in the same manner as Example 7 except that the use amount of the flame retardant ("HCA-HQ-HST"; manufactured by Sanko Co., Ltd.; 10-(2,5-dihydroxyphenyl)-9,10-dihydro-9-oxa-10-phosphaphenanthlene-10-oxide) was changed from 5 parts to 2 parts and that 3 parts of a flame retardant ("SPS-100"; manufactured by Otsuka Chemical Co., Ld.) was additionally used.

Example 15

A mixture of 30 parts of the biphenyl type epoxy resin ("NC-3000-L"; manufactured by Nippon Kayaku Co., Ltd.; epoxy equivalent of about 269 g/eq.), 5 parts of the epoxy resin ("WHR-991 S"; manufactured by Nippon Kayaku. Co., Ltd.; epoxy equivalent of about 265 g/eq.), 10 parts of the liquid bisphenol A type epoxy resin ("jER828EL";

manufactured by Mitsubishi Chemical Corp.; epoxy equivalent of about 180 g/eq.), 50 parts of an active ester type curing agent ("HPC8000-65T"; manufactured by DIC Corp.; active group equivalent of about 223 g/eq.; a toluene solution of 65% by mass of non-volatile portion), 10 parts of a phenol type curing agent having a triazine skeleton ("LA-3018-50P"; manufactured by DIC Corp.; hydroxy equivalent of about 151 g/eq.; a 2-methoxypropanol solution of 50% solid portion), 5 parts of a phenoxy resin ("YX7553 BH30"; manufactured by Mitsubishi Chemical Corp.; weight-average molecular weight of 35,000; a 1:1 MEK-cyclohexanone solution of 30% by mass of non-volatile portion), 10 parts of the hollow styrene particle ("XX-5598Z"; manufactured by Sekisui Kasei Co., Ltd.; average particle diameter of 0.5 μm; porosity of 35% by volume), 100 parts of the spherical silica ("SOC2" manufactured by Admatechs Co., Ltd.; average particle diameter of 0.5 μm) whose surface was treated with the aminosilane type coupling agent ("KBM573"; manufactured by Shin-Etsu Chemical Co., Ltd.), 5 parts of the flame retardant ("HCA-HQ-HST"; manufactured by Sanko Co., Ltd.; 10-(2,5-dihydroxyphenyl)-9,10-dihydro-9-oxa-10-phosphaphenanthlene-10-oxide; average particle diameter of 1.5 μm), 2 parts of 1-benzyl-2-phenylimidazole ("1B2PZ"; manufactured by Shikoku Chemicals Corp.; a methyl ethyl ketone solution of 10% by mass of a solid portion) as a curing accelerator, and 25 parts of methyl ethyl ketone was uniformly dispersed by a high speed rotation mixer to obtain a resin composition.

Example 16

A resin composition was prepared in the same manner as Example 15 except that 30 parts of a cresol novolak resin ("KA-1160"; manufactured by DIC Corp.; hydroxy equivalent of 117 g/eq.) was used in place of 50 parts of the active ester type curing agent ("HPC8000-65T"; manufactured by DIC Corp.; active group equivalent of about 223 g/eq.; a toluene solution of 65% by mass of non-volatile portion) and 10 parts of the phenol type curing agent having a triazine skeleton ("LA-3018-50P"; manufactured by DIC Corp.; hydroxy equivalent of about 151 g/eq.; a 2-methoxypropanol solution of 50% solid portion), and that 2 parts of a curing accelerator (4-dimethylaminopyridine (DMAP); a methyl ethyl ketone solution of 5% by mass of solid portion) was used in place of 2 parts of the curing accelerator (1-benzyl-2-phenylimidazole ("1B2PZ"; manufactured by Shikoku Chemicals Corp.; methyl ethyl ketone solution of 10% by mass of a solid portion)).

Example 17

A resin composition was prepared in the same manner as Example 16 except that 30 parts of a bisphenol A dicyanate prepolymer ("BA230S75"; manufactured by Lonza Japan Ltd.; cyanate equivalent of about 232 g/eq.; an MEK solution of 75% by mass of non-volatile portion) and 5 parts of a phenol novolak type polyfunctional cyanate ester resin ("PT30"; manufactured by Lonza Japan Ltd.; cyanate equivalent of about 124 g/eq.; an MEK solution of 80% by mass of non-volatile portion) were used in place of 30 parts of the cresol novolak resin ("KA-1160"; manufactured by DIC Corp.; hydroxy equivalent of 117 g/eq.), and that 2 parts of a curing accelerator (an MEK solution of 1% by mass of cobalt(III) acetylacetonate (manufactured by Tokyo Chemical Industry Co., Ltd.)) was additionally used.

Example 18

A resin composition was prepared in the same manner as Example 15 except that 10 parts of the bisphenol AF type epoxy resin ("YX7760"; manufactured by Mitsubishi Chemical Corp.; epoxy equivalent of about 238 g/eq.), 20 parts of the modified naphthalene type epoxy resin ("ESN-475V"; manufactured by Nippon Steel Chemical & Materials Co., Ltd.; epoxy equivalent of about 330 g/eq.), and 5 parts of the naphthalene type polyfunctional epoxy resin ("HP-4710"; manufactured by DIC Corp.; epoxy equivalent of about 170 g/eq.) were used in place of 30 parts of the biphenyl type epoxy resin ("NC-3000-L"; manufactured by Nippon Kayaku Co., Ltd.; epoxy equivalent of about 269 g/eq.) and 5 parts of the epoxy resin ("WHR-9915"; manufactured by Nippon Kayaku Co., Ltd.; epoxy equivalent of about 265 g/eq.), and that 3 parts of the flame retardant ("SPS-100"; manufactured by Otsuka Chemical Co., Ld.) was used in place of 5 parts of the flame retardant ("HCA-HQ-HST"; manufactured by Sanko Co., Ltd.; 10-(2,5-dihydroxyphenyl)-10-hydro-9-oxa-10-phosphaphenanthlene-10-oxide).

Example 19

A resin composition was prepared in the same manner as Example 15 except that 46 parts of an active ester type curing agent ("EXB9460S-65T"; manufactured by DIC Corp.; active group equivalent of about 223 g/eq.; a toluene solution of 65% by mass of non-volatile portion) was used in place of 50 parts of the active ester type curing agent ("HPC8000-65T"; manufactured by DIC Corp.; active group equivalent of about 223 g/eq.; a toluene solution of 65% by mass of non-volatile portion).

Example 20

A resin composition was prepared in the same manner as Example 15 except that the use amount of the active ester type curing agent ("HPC8000-65T"; manufactured by DIC Corp.; active group equivalent of about 223 g/eq.; a toluene solution of 65% by mass of non-volatile portion) was changed from 50 parts to 45 parts, that the use amount of the phenol type curing agent having a triazine skeleton ("LA-3018-50P"; manufactured by DIC Corp.; hydroxy equivalent of about 151 g/eq.; a 2-methoxypropanol solution of 50% solid portion) was changed from 10 parts to 5 parts, and that 4.5 parts of a benzoxazine compound ("ODA-BOZ"; manufactured by JFE Chemical Corp.) and 10 parts of a carbodiimide type curing agent ("V-03"; manufactured by Nisshinbo Chemical Inc.; active group equivalent of about 216 g/eq.; a toluene solution of 50% by mass of solid portion) were additionally used.

Comparative Example 1

A resin composition was prepared in the same manner as Example 1 except that 10 parts of the core-shell type rubber particle ("IM401-4-14"; manufactured by Aica Kogyo Co., Ltd.; the core portion is formed of polybutadiene and the shell portion is formed of a copolymer of styrene and divinyl benzene) was used in place of 10 parts of the hollow styrene particle ("XX-5598Z"; manufactured by Sekisui Kasei Co., Ltd.; average particle diameter of 0.5 μm; porosity of 35% by volume).

Comparative Example 2

A resin composition was prepared in the same manner as Example 1 except that 10 parts of the hollow styrene particle ("XX-5598Z"; manufactured by Sekisui Kasei Co., Ltd.; average particle diameter of 0.5 μm; porosity of 35% by volume) was not used.

Comparative Example 3

A resin composition was prepared in the same manner as Example 15 except that 10 parts of the core-shell type rubber particle ("IM401-4-14"; manufactured by Aica Kogyo Co., Ltd.; the core portion is formed of polybutadiene and the shell portion is formed of a copolymer of styrene and divinyl benzene) was used in place of 10 parts of the hollow styrene particle ("XX-5598Z"; manufactured by Sekisui Kasei Co., Ltd.; average particle diameter of 0.5 μm: porosity of 35% by volume).

Comparative Example 4

A resin composition was prepared in the same manner as Example 15 except that 10 parts of the hollow styrene particle ("XX-5598Z"; manufactured by Sekisui Kasei Co., Ltd.; average particle diameter of 0.5 μm; porosity of 35% by volume) was not used.

Comparative Example 5

A resin composition was prepared in the same manner as Example 15 except that 10 parts of a hollow aluminosilicate particle ("MG-005"; manufactured by Taiheiyo Cement Corp.; average particle diameter of 1.6 μM; porosity of 80% by volume) was used in place of 10 parts of the hollow styrene particle ("XX-5598Z"; manufactured by Sekisui Kasei Co., Ltd.; average particle diameter of 0.5 μm; porosity of 35% by volume).

Test Example 1: Measurement of Dielectric Constant and Dielectric Loss Tangent (1) Preparation of Cured Product for Assessment A dual copper clad laminate using a glass cloth substrate impregnated with an epoxy resin ("R5715ES"; manufactured by Panasonic Corp.; thickness of 0.7 mm; 255 mm square) was superposed on a release-untreated surface of a release-treated PET film ("501010"; manufactured by Lintec Corp.; thickness of 50 μm; 240 mm square); and then, four sides of the laminate were fixed to this film by using a polyimide adhesive tape (width of 10 mm) (hereinafter, this PET film is also called "fixed PET film").

The resin composition prepared in each of Examples and Comparative Examples was applied by using a die coater onto the release-treated surface of the "fixed PET film" such that a thickness of the resin composition layer after dried might become 40 μm; and then, this was dried for 10 minutes in the temperature range of 80 to 120° C. (average 100° C.) to obtain a resin sheet.

Next, after this resin sheet was put in an oven heated at 180° C., the resin composition layer was thermally cured for 90 minutes under this curing condition.

After thermal curing, the polyimide adhesive tape was removed, and then, a cured product was removed from the dual copper clad laminate using a glass cloth substrate impregnated with an epoxy resin. Next, the PET film ("501010"; manufactured by Lintec Corp.) was also removed to obtain a cured product in the form of a sheet. The cured product thus obtained is called "cured product for assessment".

(2) Measurements of Relative Dielectric Constant and Dielectric Loss Tangent

The cured product for assessment was cut to the size of 80 mm length and 2 mm width to obtain an assessment sample. The relative dielectric constant and the dielectric loss tangent (tan δ) of the assessment sample were measured using "HP8362B" instrument manufactured by Agilent Technologies, Inc. by a cavity resonance perturbation method with a measurement frequency of 5.8 GHz and a measurement temperature of 23° C. Measurement was done for two test pieces to calculate an average value of them.

Test Example 2: Assessment of Reflow Resistance (1) Lamination of Resin-Attached Copper Foil Sheet The resin composition prepared in each of Examples and Comparative Examples was applied by using a die coater onto a copper foil ("JDLC"; manufactured by JX Nippon Mining & Metals Corp.; thickness of 12 μm; 240 mm square) such that a thickness of the resin composition layer after dried might become 40 μm; and then, this was dried for 10 minutes in the temperature range of 80 to 120° C. (average 100° C.) to obtain a resin-attached copper foil sheet. This resin-attached copper foil sheet was laminated by using a batch type vacuum press laminator ("MVLP-500"; manufactured by Meiki Co., Ltd.) such that the resin composition layer might contact with both surfaces of the laminate. The lamination was carried out such that after the pressure inside the laminator was reduced to 13 hPa or less by evacuation for 30 seconds, the sheet was pressed with the pressure of 0.74 MPa at 100° C. for 30 seconds.

(2) Curing of the Resin Composition Layer

The laminate thereby laminated with the resin-attached copper foil sheet was heated under the curing condition of 180° C. for 30 minutes to cure the resin composition layer to form an insulating layer. This layer is called "Assessment Substrate A".

(3) Blister Assessment in the Reflow Process

Assessment Substrate A was cut to a small specimen having the size of 100 mm×50 mm. Then, this was passed 10 times through a reflow apparatus (HAS-6116"; manufactured by Antom Japan Co., Ltd.) that reproduces a solder reflow temperature of 260° C. as a peak temperature (confirming to the reflow temperature profile in accordance with IPC/JEDEC J-STD-020C).

The assessment was carried with regard to these two specimens. When abnormality such as 5 or more blisters was observed in the conductive layer by a visual observation, this was assessed with the symbol of "X"; when abnormality such as 1 to 4 blisters was observed in the conductive layer, this was assessed with the symbol of "Δ"; and when there was no abnormality at all in both the specimens, this was assessed with the symbol of "○".

Test Example 3: Assessment of Smear Removal (1) Preparation of Assessment Substrate Both the copper surfaces of the dual copper clad laminate using a glass cloth substrate impregnated with an epoxy resin ("R1515A"; manufactured by Panasonic Corp.; thickness of copper foil: 18 μm; thickness of substrate: 0.4 mm)—the laminate having been formed with a surface-treated circuit of a circuit board—were subjected to a roughening treatment by etching (1 μm) with a micro-etching agent ("CZ8100"; manufactured by MEC Co., Ltd.).

(2) Lamination of the Resin Sheet

The resin sheet prepared in Test Example 1 (1) was laminated on both the surfaces of the circuit boards by using a batch type vacuum press laminator ("CVP700"; two-stage build-up laminator manufactured by Nichgo-Morton Co., Ltd.) such that the resin composition layers might contact with the circuit boards. The lamination was carried out such that after the pressure inside the laminator was reduced to 13 hPa or less by evacuation for 30 seconds, the resin sheets were press-adhered thereto with the pressure of 0.74 MPa at 110° C. for 30 seconds. Then, the resin sheets thus laminated were smoothed by hot pressing with the pressure of 0.5 MPa at 110° C. under an atmospheric pressure for 60 seconds.

(3) Curing of the Resin Composition Layers

After lamination with the resin sheets, the resin composition layers were thermally cured to form cured bodies on both the surfaces of the circuit boards. Thermal curing of the resin composition layers was carried out by the following thermal curing procedure. Namely, this was heated at 100° C. for 30 minutes (after placed in an oven of 100° C.); and next, this was thermally cured at 180° C. for 30 minutes (after transferred to an oven of 180° C.). Then, the board was taken out to an atmosphere of room temperature.

(4) Formation of Via Hole

A via hole was formed by drilling the insulating layer under the state of being attached with the support (PET film) by using a $CO_2$ laser processing machine ("LC-2E21B/1C"; manufactured by Hitachi Via Mechanics, Ltd.) with a mask diameter of 1.60 mm, a focus off-set value of 0.050, a pulse width of 25 µs, a power of 0.66 W, an aperture of 13, a shot number of 2, and a burst mode. The top diameter (diameter) of the via hole in the insulating layer surface was 50 µm. After formation of the via hole, the support (PET film) was removed.

(5) Roughening Treatment

The board formed with the via hole was soaked in a swelling liquid ("Swelling Dip Securiganth P"; manufactured by Atotech Japan Co., Ltd.; an aqueous solution of diethylene glycol monobutyl ether and sodium hydroxide) at 60° C. for 10 minutes, and then, in an oxidant ("Concentrate Compact CP"; manufactured by Atotech Japan Co., Ltd.; an aqueous solution containing $KMnO_4$: 60 g/L and NaOH: 40 g/L) at 80° C. for 20 minutes, and finally, in a neutralization solution ("Reduction Solution Securiganth P"; manufactured by Atotech Japan Co., Ltd.; an aqueous solution of sulfuric acid solution) at 40° C. for 5 minutes. Then, this was dried at 80° C. for 30 minutes to form roughened bodies on both surfaces of the circuit board. The board thus obtained is called "Assessment Board B".

(6) Assessment of Smear Removal Property

The via hole bottom of Assessment Board B was observed with a scanning electron microscope ("S-4800"; manufactured by Hitachi High-Tech Corp.). From the picture thereby obtained, a maximum smear length from a wall surface of the via hole bottom was measured. When the maximum smear length was less than 3 µm, this was assessed with the symbol of "○", and when the maximum smear length was 3 µm or more, this was assessed with the symbol of "X".

Test Example 4: Assessment of Warp (1) Lamination of the Resin Sheet

The resin sheet prepared in Test Example 1 (1) was cut out to the size of a 9.5-cm square, and this was laminated to the roughened surface of a copper foil ("3EC-III"; manufactured by Mitsui Mining & Smelting Co., Ltd.; thickness of 35 µm), which had been cut out to the size of a 10-cm square, by using the batch type vacuum press laminator ("MVLP-500"; manufactured by Meiki Co., Ltd.). The lamination was carried out such that they were press-adhered to each other with the pressing pressure of 0.74 MPa at 120° C. for 30 seconds after the pressure inside the laminator was reduced to 13 hPa or less by evacuation for 30 seconds to form a metal foil attached with the resin composition layer. Then, from this the PET film was removed.

(2) Curing of the Resin Composition Layer

Four sides of the metal foil attached with the resin composition layer obtained in (1) were adhered to a SUS plate having the thickness of 1 mm by means of a polyimide tape so as to make the resin composition layer on an upper side; and then, the resin composition layer was cured under the curing condition of 180° C. for 30 minutes.

(3) Measurement of Warp

Among four sides of the metal foil attached with the cured layer obtained in (2), polyimide tapes of the three sides were removed. Then, the warp amount was obtained from the height at the highest point from the SUS plate. When the warp amount was less than 1 cm, this was expressed with the symbol "○"; when the warp amount was 1 cm or more and less than 3 cm, this was expressed with the symbol "Δ"; and when the warp amount was 3 cm or more, this was expressed with the symbol "X".

Test Example 5: Assessment of Crack after Desmear (Roughening Treatment)

The resin composition prepared in each of Examples and Comparative Examples was applied onto the release-treated surface of the "fixed PET film" by using a die coater such that the thickness of the resin composition layer after dried might become 25 µm. This was then dried in the temperature range of 80 to 120° C. (average 100° C.) for 10 minutes to obtain a resin sheet. This resin sheet was laminated to both surfaces of a core material ("E705GR"; manufactured by Hitachi Chemical Co., Ltd.; thickness of 400 µm) by using a batch type vacuum pressure laminator ("CVP700"; two-stage build up laminator; manufactured by Nikko-Materials Co., Ltd.) such that the resin composition layer might be bonded to the inner substrate thereby laminating to both surfaces of the inner substrate. Here, the core material had 350-µm diameter circular copper pads (copper thickness of 35 µm) formed in a lattice-like form with the distance of 400 µm therebetween and with the residual copper rate of 60%. The lamination was carried out such that they were press-adhered with the pressing pressure of 0.74 MPa at 100° C. for 30 seconds after the pressure inside the laminator was reduced to 13 hPa or less by evacuation for 30 seconds. This was heated in an oven at 130° C. for 30 minutes; and then, this was transferred to a different oven at 170° C. and heated for 30 minutes. After the support was removed, the circuit board thereby obtained was soaked in "Swelling Dip Securiganth P", the swelling liquid manufactured by Atotech Japan Co., Ltd., at 60° C. for 10 minutes. Next, this was soaked in "Concentrate Compact CP" (an aqueous solution containing $KMnO_4$: 60 g/L and NaOH: 40 g/L), the roughening solution manufactured by Atotech Japan Co., Ltd., at 80° C. for 30 minutes. Finally, this was soaked in "Reduction Solution Securiganth P", the neutralization solution manufactured by Atotech Japan Co., Ltd., at 40° C. for 5 minutes. Then, 100 copper pads of the circuit board after the roughening treatment were observed to confirm the existence of the cracks. When the number of the crack was 10 or less, this was assessed with the symbol of "0"; and when the number of the crack was more than 10, this was assessed with the symbol of "X".

Use amounts of the non-volatile components in the resin composition in each of Examples and Comparative Examples, as well as the measurement results and assessment results of Test Examples are summarized in Table 1 below.

TABLE 1

| | | | | | 1 | 2 | 3 | 4 | 5 | 6 | 7 | 8 | 9 | 10 | 11 | 12 |
|---|---|---|---|---|---|---|---|---|---|---|---|---|---|---|---|---|
| Non-Volatile Components (parts by mass) | (A) | Hollow Organic Polymer Particle | Hollow Styrene Particle (0.5 μm) | XX-5598Z | 10 | 3 | 35 | 35 | 5 | | 10 | 10 | 10 | 10 | 10 | 10 |
| | | | Hollow Styrene Particle (8 μm) | Synthesis Example 2 | | | | | | 10 | | | | | | |
| | | | Hollow Acrylic Particle (10 μm) | TECHPOLYMER | | | | | | | | | | | | |
| | (A') | Non-Hollow Organic Polymer Particle | Core-Shell Rubber Particle | IM-401-4-14 | | | | | 5 | | | | | | | |
| | (B) | Epoxy Resin | Solid | NC-3000-L | 20 | 20 | 20 | 20 | 20 | 20 | 10 | | | | | |
| | | | | WHR-991S | 5 | 5 | 5 | 5 | 5 | 5 | 5 | | | | | |
| | | | | YX7760 | | | | | | | | 5 | 5 | 5 | 5 | 5 |
| | | | | HP-7200L | | | | | | | | 10 | 10 | | | |
| | | | | ESN475V | | | | | | | | | | 10 | | |
| | | | | HP-4710 | | | | | | | | | | | 3 | |
| | | | | HP-6000 | | | | | | | | | | | 10 | 10 |
| | | | Liquid | HP-4032SS | | | | | | | | | | | 7 | 10 |
| | | | | jER828EL | | | | | | | | | | | | |
| | (C-1) | Epoxy Curing Agent | Active Ester Type | HPC6000-65T | | | | | | | 10 | 10 | 10 | 10 | | |
| | | | Phenol Type | EXB9460S-65T | | | | | | | | | | | | |
| | | | | LA3018-50P | | | | | | | | | | | | |
| | | | Cyanate Ester Type | KA1166 | | | | | | | | | | | | |
| | | | Benzoxazine Type | BA230S75 | | | | | | | | | | | | |
| | | | | PT30 | | | | | | | | | | | | |
| | | | Carbodiimide Type | ODA-BOZ | | | | | | | | | | | | |
| | | | | V-03 | | | | | | | | | | | | |
| | (C-2) | Curing Accelerator | Imidazole Type | 1B2PZ | 0.2 | 0.2 | 0.2 | 0.2 | 0.2 | 0.2 | 0.2 | 0.2 | 0.2 | 0.2 | 0.2 | 0.2 |
| | | | Amine Type | DMAP | | | | | | | | | | | | |
| | | | Metal Type | Co(III) | | | | | | | | | | | | |
| | (D) | Inorganic Filler | Hollow Aluminosilicate Particle | MG-005 | | | | | | | | | | | | |
| | | | Spherical Silica Particle | UFP-30 | 15 | 15 | 10 | | 15 | 15 | 15 | 15 | 15 | 15 | 15 | 15 |
| | | | | SOC2 | | | | | | | | | | | | |
| | (E) | Flame Retardant | Phosphinate Ester | HCA-HQ-HST | 5 | 5 | 5 | 5 | 5 | 5 | 5 | 5 | 5 | 5 | 5 | 5 |
| | | | Phosphazene Compound | SPS-100 | | | | | | | | | | | | |
| | (F) | Elastomer | Polybutadiene Resin | Synthesis Example 1 | 25 | 25 | 25 | 25 | 25 | 25 | 25 | 25 | 25 | 25 | 25 | 25 |
| | (G) | Thermoplastic Resin | Phenoxy Resin | YX7553BH30 | | | | | | | | | | | | |
| Total of Non-Volatile Components | | | | | 80.2 | 73.2 | #### | 90.2 | 80.2 | 80.2 | 80.2 | 80.2 | 80.2 | 80.2 | 80.2 | 80.2 |
| Content of Components (Based on 100% by mass of non-volatile components in the resin composition) | Content of (A) (% by mass) | | | | 12.5 | 4.1 | 34.9 | 38.8 | 6.2 | 12.5 | 12.5 | 12.5 | 12.5 | 12.5 | 12.5 | 12.5 |
| | Content of (B) (% by mass) | | | | 31.2 | 34.2 | 25.0 | 27.7 | 31.2 | 31.2 | 18.7 | 18.7 | 18.7 | 18.7 | 22.4 | 18.7 |
| | Content of (C-1) (% by mass) | | | | 0.25 | 0.27 | 0.20 | 0.22 | 0.25 | 0.25 | 0.25 | 0.25 | 0.25 | 0.25 | 0.25 | 0.25 |
| | Content of (C-2) (% by mass) | | | | | | 10.0 | | | | | | | | | |
| | Content of (D) (% by mass) | | | | 18.7 | 20.5 | | | 18.7 | 18.7 | 18.7 | 18.7 | 18.7 | 18.7 | 18.7 | 18.7 |

TABLE 1-continued

| | | | | Example | | | | | | | | | Comparative Examples | | | | |
|---|---|---|---|---|---|---|---|---|---|---|---|---|---|---|---|---|---|
| | | | | 13 | 14 | 15 | 16 | 17 | 18 | 19 | 20 | 1 | 2 | 3 | 4 | 5 |
| Characteristics | | | Content of (E) (% by mass) | 6.2 | 6.8 | 5.0 | 5.5 | 6.2 | 6.2 | 6.2 | 6.2 | 6.2 | 6.2 | 6.2 | 6.2 | 6.2 |
| | | | Content of (F) (% by mass) | 31.2 | 34.2 | 25.0 | 27.7 | 31.2 | 31.2 | 31.2 | 31.2 | 31.2 | 31.2 | 31.2 | 31.2 | 31.2 |
| | | | Content of (G) (% by mass) | | | | | | | | | | | | | |
| | | | Assessment of Smear Removal | ○ | ○ | ○ | ○ | ○ | ○ | ○ | ○ | ○ | ○ | ○ | ○ | ○ |
| | | | Assessment of Warp | ○ | ○ | ○ | ○ | ○ | ○ | ○ | ○ | ○ | ○ | ○ | ○ | ○ |
| | | | Assessment of Crack | ○ | ○ | ○ | ○ | ○ | ○ | ○ | ○ | ○ | ○ | ○ | ○ | ○ |
| | | | Assessment of Reflow Resistance | ○ | ○ | ○ | ○ | ○ | ○ | ○ | ○ | ○ | ○ | ○ | ○ | ○ |
| | | | Dielectric Constant | 2.56 | 2.75 | 2.40 | 2.30 | 2.50 | 2.50 | 2.55 | 2.60 | 2.50 | 2.50 | 2.60 | 2.60 | 2.60 |
| | | | Dielectric Loss Tangent | 0.01 | 0.01 | 0.01 | 0.01 | 0.01 | 0.01 | 0.01 | 0.01 | 0.01 | 0.01 | 0.01 | 0.01 | 0.01 |
| Non-Volatile Components (parts by mass) | (A) | Hollow Organic Polymer Particle | Hollow Styrene Particle (0.5 μm) XX-5598Z | 10 | 10 | 10 | 10 | 10 | 10 | 10 | 10 | | | | | |
| | | | Hollow Styrene Particle (8 μm) Synthesis Example 2 | | | | | | | | | | | | | |
| | | | Hollow Acrylic Particle (10 μm) TECHPOLYMER | | | | | | | | | | | | | |
| | (A') | Non-Hollow Organic Polymer Particle | Core-Shell Rubber Particle IM-401-4-14 | | | | | | | | | 10 | 15 | 10 | | |
| | (B) | Epoxy Resin | Solid NC-3000-L | 10 | 10 | 30 | 30 | 30 | 10 | 30 | 30 | 20 | 20 | 30 | 30 | 30 |
| | | | WHR-991S | 5 | 5 | 5 | 5 | 5 | 5 | 5 | 5 | 5 | 5 | 5 | 5 | 5 |
| | | | YX7760 | | | | | | 10 | | | | | | | |
| | | | HP-7200L | | | | | | | | | | | | | |
| | | | ESN475V | | | | | | 20 | | | | | | | |
| | | | HP-4710 | | | | | | 5 | | | | | | | |
| | | | HP-6000 | | | | | | | | | | | | | |
| | | | HP-4032SS | | | | | | | | | | | | | |
| | | Liquid | jER828EL | | | | | | | | | | | | | |
| | (C-1) | Epoxy Curing Agent | Active Ester Type HPC6000-65T | 10 | 10 | 10 | 10 | 10 | 10 | 10 | 10 | | | 10 | 10 | 10 |
| | | | EXB9460S-65T | 32.5 | | 32.5 | | | 32.5 | 29.9 | 29.3 | | | 32.5 | 32.5 | 32.5 |
| | | | Phenol Type LA3018-50P | 5 | | 5 | 30 | | 5 | 5 | | | | 5 | 5 | 5 |
| | | | KA1166 | | | | | | | | 2.5 | | | | | |
| | | | Cyanate Ester Type BA230S75 | | | | | 22.5 | | | | | | | | |
| | | | PT30 | | | | | 4 | | | | | | | | |
| | | | Benzoxazine Type ODA-BOZ | | | | | | | | 4.5 | | | | | |
| | | | Carbodiimide Type V-03 | | | | | | | | 5 | | | | | |
| | (C-2) | Curing Accelerator | Imidazole Type 1B2PZ | 0.2 | 0.2 | 0.2 | | | 0.2 | 0.2 | 0.2 | 0.2 | 0.2 | 0.2 | 0.2 | 0.2 |
| | | | Amine Type DMAP | | | | 0.1 | 0.1 | | | | | | | | |
| | | | Metal Type Co(III) | | | | | 0.02 | | | | | | | | |
| | (D) | Inorganic Filler | Hollow Aluminosilicate Particle MG-005 | | | | | | | | | | | | | 10 |
| | | | Spherical Silica Particle UFP-30 | 30 | 15 | 100 | 100 | 100 | 100 | 100 | 100 | 15 | | | | |
| | | | SOC2 | 5 | 2 | 5 | 5 | 5 | 3 | 5 | 5 | 5 | | | | |
| | (E) | Flame Retardant | Phosphinate Ester HCA-HQ-HST | | 3 | | | | | | | | | | | |
| | | | Phosphazene Compound SPS-100 | | | | | | | | | | 5 | 5 | 5 | 5 |

TABLE 1-continued

| | | | | | | | | | | | | | | | |
|---|---|---|---|---|---|---|---|---|---|---|---|---|---|---|---|
| (F) Elastomer | | 25 | 25 | 1.5 | 1.5 | 1.5 | 1.5 | 1.5 | 1.5 | 25 | 25 | 1.5 | 1.5 | 1.5 |
| (G) Thermoplastic Resin | Polybutadiene Resin Synthesis Example 1 | | | #### | #### | #### | #### | #### | #### | | | #### | #### | #### |
| | Phenoxy Resin YX7553BH30 | 95.2 | 80.2 | 5.0 | 5.2 | 5.3 | 5.1 | 5.1 | 4.9 | 80.2 | 70.2 | 17.6 | 18.5 | 17.6 |
| Total of Non-Volatile Components | | 10.5 | 12.5 | 17.6 | 18.3 | 18.6 | 17.7 | 17.8 | 17.2 | 31.2 | 35.6 | 18.8 | 19.8 | 18.8 |
| Content of Components (Based on 100% by mass of non-volatile components in the resin composition) | Content of (A) (% by mass) | 15.8 | 18.7 | 18.8 | 15.7 | 14.1 | 19.0 | 17.8 | 20.3 | 0.25 | 0.28 | 0.10 | 0.11 | 0.10 |
| | Content of (B) (% by mass) | | | 0.10 | 0.05 | 0.06 | 0.10 | 0.10 | 0.10 | 18.7 | 21.4 | 50.2 | 52.9 | 55.2 |
| | Content of (C-1) (% by mass) | 0.21 | 0.25 | 50.2 | 52.2 | 53.2 | 50.7 | 50.9 | 49.3 | 6.2 | 7.1 | 2.5 | 2.6 | 2.5 |
| | Content of (C-2) (% by mass) | 31.5 | 18.7 | 2.5 | 2.6 | 2.7 | 1.5 | 2.5 | 2.5 | 31.2 | 35.6 | | | |
| | Content of (D) (% by mass) | 5.3 | 6.8 | | | | | | | | | | | |
| | Content of (E) (% by mass) | 26.3 | 31.2 | | | | | | | | | | | |
| | Content of (F) (% by mass) | | | 0.75 | 0.78 | 0.80 | 0.76 | 0.76 | 0.74 | | | 0.75 | 0.79 | 0.75 |
| | Content of (G) (% by mass) | | | | | | | | | | | | | |
| Characteristics | Assessment of Smear Removal | ○ | ○ | ○ | ○ | ○ | ○ | ○ | ○ | × | × | × | × | × |
| | Assessment of Warp | ○ | ○ | ○ | ○ | ○ | ○ | ○ | ○ | ○ | ○ | ○ | × | × |
| | Assessment of Crack | ○ | ○ | ○ | ○ | ○ | ○ | ○ | ○ | ○ | ○ | ○ | × | × |
| | Assessment of Reflow Resistance | ○ | ○ | ○ | ○ | ○ | ○ | ○ | ○ | × | × | ○ | ○ | ○ |
| | Dielectric Constant | 2.80 | 2.50 | 2.95 | 3.00 | 2.95 | 2.90 | 2.95 | 2.95 | 2.80 | 2.75 | 3.20 | 3.20 | 2.90 |
| | Dielectric Loss Tangent | 0.01 | 0.01 | 0 | 0.01 | 0 | 0 | 0 | 0 | 0.01 | 0.01 | 0 | 0 | 0 |

From the above results, it became clear that when the resin composition including (A) the hollow organic polymer particle is used, the cured product provided with a smear removal property can be obtained. Also, it became clear that in one embodiment the cured product of the resin composition including (A) the hollow organic polymer particle can be provided with a superior reflow resistance, can suppress generation of a warp at the time of curing, and a crack, and can be provided with superior electric characteristics.

Reference Example 1: Section of Cured Product

The cross section of the cured product for assessment, based on the resin composition of Example 1, obtained in Test Example 1, was photographed. This photograph was taken by using an FIB-SEM composite apparatus ("SMI3050SE"; manufactured by SII Nanotechnology Inc.). The picture thus photographed is illustrated in FIG. 1. From the picture in FIG. 1, it can be seen that the void in (A) the hollow organic polymer particle still remains in the cured product obtained even after the resin composition according to the present invention was cured.

The invention claimed is:

1. A resin composition, comprising:
   (A) at least one hollow particle formed of an organic polymer of at least one monomer comprising an aromatic vinyl unsaturated monomer;
   (B) at least one epoxy resin;
   (C) at least one curing agent which is at least one selected from an active ester curing agent, a phenol curing agent, a naphthol curing agent, a benzoxazine curing agent, a carbodiimide curing agent, an amine curing accelerator, an imidazole curing accelerator, and a metal curing accelerator;
   (D) at least one silica; and
   (E) at least one phosphorus type flame retardant,
   wherein
   said at least one hollow particle (A) has an average particle diameter of 0.2 µm to 8 µm:
   said at least one hollow particle (A) is present in an amount of 3% to 50% by mass, based on 100% by mass of non-volatile components in the resin composition;
   said at least one epoxy resin (B) is present in an amount of 10% to 40% by mass, based on 100% by mass of non-volatile components in the resin composition;
   said at least one curing agent (C) is present in an amount of 0.01% to 30% by mass, based on 100% by mass of non-volatile components in the resin composition;
   said at least one silica (D) is present in an amount of 60% or less by mass, based on 100% by mass of non-volatile components in the resin composition; and
   said at least one phosphorus type flame retardant (E) is present in an amount of 0.1% to 10% by mass, based on 100% by mass of non-volatile components in the resin composition.

2. The resin composition according to claim 1, wherein said at least one hollow particle (A) is a hollow particle formed of an organic polymer of at least one monomer comprising styrene.

3. The resin composition according to claim 1, wherein said at least one hollow particle (A) is a single-hollow particle.

4. The resin composition according to claim 1, wherein said at least one hollow particle (A) has a porosity of 20% or more by volume.

5. The resin composition according to claim 1, wherein said at least one phosphorus type flame retardant (E) comprises a phosphorous type flame retardant having a phenolic hydroxyl group.

6. The resin composition according to claim 1, further comprising:
   (F) at least one elastomer.

7. The resin composition according to claim 6, wherein said at least one elastomer (F) is a resin having one or more structures selected from a polybutadiene structure, a polysiloxane structure, a poly(meth)acrylate structure, a polyalkylene structure, a polyalkyleneoxy structure, a polyisoprene structure, a polyisobutylene structure, and a polycarbonate structure.

8. The resin composition according to claim 7, wherein said at least one elastomer (F) comprises a resin having a polybutadiene structure.

9. The resin composition according to claim 8, wherein said at least one elastomer (F) comprises a polybutadiene resin having a phenolic hydroxyl group.

10. A cured product of a resin composition according to claim 1.

11. A laminate in a sheet Ruin, comprising a resin composition according to claim 1.

12. A resin sheet, comprising a support and a resin composition layer formed on said support, in which said resin composition layer is formed of a resin composition according to claim 1.

13. A printed wiring board, comprising an insulating layer comprising a cured product of a resin composition according to claim 1.

14. A semiconductor device, comprising a printed wiring board according to claim 13.

15. The resin composition according to claim 1, wherein said at least one hollow particle (A) has an average particle diameter of 0.5 µm to 8 µm.

* * * * *